US009793866B2

(12) United States Patent
Chen

(10) Patent No.: US 9,793,866 B2
(45) Date of Patent: Oct. 17, 2017

(54) SINGLE STAGE SWITCHING POWER AMPLIFIER WITH BIDIRECTIONAL ENERGY FLOW

(71) Applicant: GuangDong Redx Electrical Technology Limited, Dong Guan (CN)

(72) Inventor: Xue Jian Chen, Dong Guan (CN)

(73) Assignee: GuangDong Redx Electrical Technology Limited, Dongguan, Guangdong (CN)

( * ) Notice: Subject to any disclaimer, the term of this patent is extended or adjusted under 35 U.S.C. 154(b) by 0 days.

(21) Appl. No.: 15/090,534

(22) Filed: Apr. 4, 2016

(65) Prior Publication Data
US 2016/0218686 A1    Jul. 28, 2016

Related U.S. Application Data

(63) Continuation of application No. 14/086,946, filed on Nov. 21, 2013, now Pat. No. 9,306,516.
(Continued)

(51) Int. Cl.
*H03F 3/217*  (2006.01)
*H02M 1/34*  (2007.01)
(Continued)

(52) U.S. Cl.
CPC ............ *H03F 3/2171* (2013.01); *H02M 1/34* (2013.01); *H02M 2001/0038* (2013.01);
(Continued)

(58) Field of Classification Search
CPC ..... H02M 1/34; H04B 2001/045; H03F 3/217
(Continued)

(56) References Cited

U.S. PATENT DOCUMENTS

| 4,992,751 A | * | 2/1991 | Attwood | ................. | H03F 3/38 |
| | | | | | 330/10 |
| 5,541,827 A | * | 7/1996 | Allfather | ........... | H02M 3/33576 |
| | | | | | 363/17 |

(Continued)

FOREIGN PATENT DOCUMENTS

EP       000386933       *  9/1990  ............... H03F 3/38

OTHER PUBLICATIONS

Ljusev, P. and Andersen, M.A.E., "Direct-conversion switching-mode audio power amplifier with active capacitive voltage clamp", Power Electronics Specialists Conference, 2005. PESC '05. IEEE 36th, pp. 2848-2854.*

(Continued)

*Primary Examiner* — Steven J Mottola
*Assistant Examiner* — Hafizur Rahman
(74) *Attorney, Agent, or Firm* — Jundong Ma

(57) ABSTRACT

A switching amplifier realizes bidirectional energy flow and combines switching and power amplification into one single stage so as to increase system efficiency. The modulator circuit of the amplifier receives and modulates an input signal, and generates and outputs modulated driver signals, which are used by the power driver circuit to generate signals to drive switching transformers of an amplifier circuit of the amplifier, and control signals, which are used to control an output generator circuit so as to allow individual inductors across the load by enabling current flowing through the load to have a path to ground. The amplifier circuit comprises switching transformers as well as circuitries configured to capture energy returned from the load and enable the captured energy to flow back to a power supply circuit of the amplifier through an energy flow-back circuit of the amplifier.

14 Claims, 12 Drawing Sheets

Related U.S. Application Data

(60) Provisional application No. 61/732,324, filed on Dec. 1, 2012.

(51) Int. Cl.
*H04B 1/04* (2006.01)
*H02M 1/00* (2006.01)

(52) U.S. Cl.
CPC ........ *H03F 3/217* (2013.01); *H03F 2200/171* (2013.01); *H03F 2200/273* (2013.01); *H03F 2200/66* (2013.01); *H04B 2001/045* (2013.01)

(58) Field of Classification Search
USPC ..... 307/17, 20, 107; 323/282; 327/128, 365, 327/384, 443; 330/9, 51, 65, 123, 189, 330/190, 207, 251, 207 A
See application file for complete search history.

(56) References Cited

U.S. PATENT DOCUMENTS

| | | | | |
|---|---|---|---|---|
| 5,963,086 | A * | 10/1999 | Hall | ........................ H03F 3/217 330/10 |
| 6,373,335 | B1 * | 4/2002 | Carver | .................. H03F 3/2175 330/10 |
| 6,496,059 | B1 * | 12/2002 | Nguyen | ................ H03F 3/2173 330/10 |
| 2009/0268486 | A1 * | 10/2009 | Ljusev | ..................... H03F 1/38 363/15 |

OTHER PUBLICATIONS

Gaalaas, "Class D Audio Amplifiers: What, Why, and How", Analog Dialogue 40-06, Jun. 2006.*

* cited by examiner

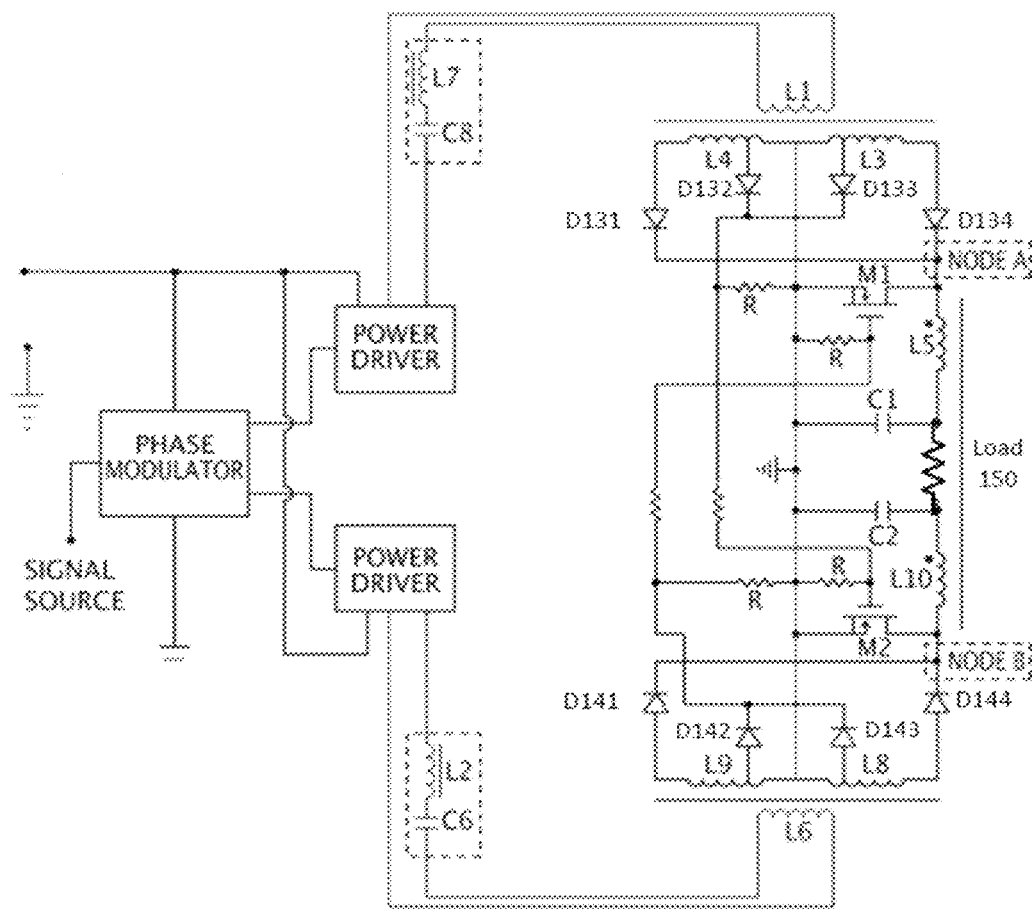
FIG. 1A
(Related Art)
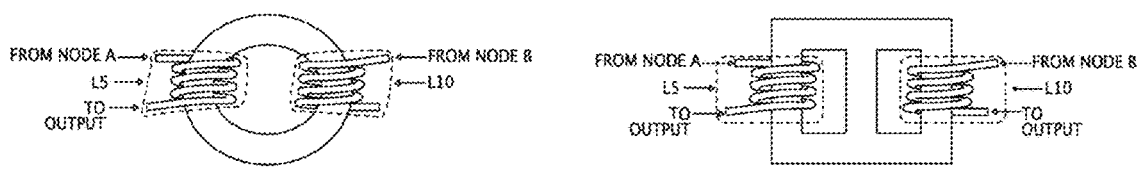
FIG. 1B
(Related Art)
FIG. 1C
(Related Art)

SINGLE STAGE SWITCHING POWER AMPLIFIER WITH BIDIRECTIONAL ENERGY FLOW

CROSS-REFERENCE TO RELATED APPLICATION

This application is a continuation application under 35 U.S.C. §120 of U.S. Non-provisional patent application Ser. No. 14/086,946, filed on Nov. 21, 2013 and claiming the benefit under 35 U.S.C. §119(e) of U.S. Provisional Application No. U.S. 61/732,324, filed on Dec. 1, 2012, the entire disclosures of both aforesaid prior applications being incorporated herein by reference.

BACKGROUND

1. Technical Field

The present disclosure generally relates to switching power amplifier, and more particularly to single stage switching power amplifier which, among other advantages, achieve bidirectional energy flow.

2. Description of the Related Art

A conventional switching power amplifier, such as a class-D power amplifier, usually undergoes at least two stages—namely, the first stage of generating needed power supply (hereinafter referred to as "the power-supplying stage") and the second stage of applying the generated power supply to amplify an input signal with one or more switching configurations (hereinafter referred to as "the power-amplifying stage")—before producing an output signal across a load coupled to the output terminals of the power amplifier, with the output signal being an amplified replica of the input signal. At each stage, such a two-stage or multi-stage power amplifier incurs power losses, resulting in lowering the system efficiency. Thus, for a switching power amplifier, reducing the number of stages is one way to increase the system efficiency.

In increasing the system efficiency of a switching power amplifier, efforts have been made to combine the first "power-supplying" stage and the second "power-amplifying" stage into a single stage in delivering an amplified output signal. In particular, U.S. Patent Application Publication No. 2011/0299309 to Chen (hereinafter referred to as "the '309 application") discloses a switching power amplifier (hereinafter referred to "the '309 amplifier") where the "power-supplying" stage and the "power-amplifying" stage are combined into a single stage to increase the system efficiency. However, the '309 amplifier suffers from a number of design deficiencies, primarily due to its failure to adequately address new issues arising from combining the "power-supplying" stage and the "power-amplifying" stage into a single stage.

Referring to FIG. 1A, which shows a schematic circuit diagram of the '309 power amplifier, one design deficiency is that the '309 power amplifier requires a highly magnetically coupled pair of inductors L5 and L10 (as respective integral parts of a pair of low pass filters) across load 150 with a coupling coefficient better than 0.99, in order for the amplifier to work properly. FIGS. 1B and 1C illustrate examples of the required highly coupled pair of inductors.

To be more specific, diodes D131 and D134, the two diodes (on the secondary winding) coupled to inductor L5 via node A, are both biased in the reverse direction with respect to inductor L5. Thus, when MOSFET switch M1 (which is also coupled to node A) is turned off, diodes D131 and D134 block the current flowing in inductor L5. As a skilled artisan appreciates, if the current flowing in an inductor is blocked, a high voltage spike at the blocking end of the inductor will be caused, unless the inductor is tightly magnetically coupled with another inductor so as to induce a negative voltage on the magnetically coupled end of the other inductor to create a current flow circulation.

Thus, when the current flowing in inductor L5 is blocked by the reverse biasing of diodes D131 and D134, a high voltage spike at node A will occur (which may destroy switch M1), unless inductors L5 and L10 are tightly magnetically coupled so as to induce a negative voltage at node B (see FIGS. 1B and 1C) to create a current flow circulation through the body diode of MOSFET switch M2. Further, the coupling coefficient between inductors L5 and L10 must be better than 0.99 or the coupling would not be able to instantaneously induce the voltage of node B to go negative, which is a necessity to create the needed current flow circulation. The same situation is also applicable to inductor L10. Accordingly, without a tight magnetic coupling between inductor L5 and L10 with a coupling coefficient 0.99 or better, the '309 amplifier simply will not work properly.

As a skilled artisan also appreciates, although it may be possible to make a tight coupling of inductors L5 and L10 having a coupling coefficient of 0.99 or higher in a lab environment, it is practically impossible to make such a tight magnetic coupling between inductors in mass production. Even if such an extremely high level of coupling could be materialized in mass production, the coupling would inevitably cause a high-frequency ripple current—whose peak current can go as high as 100 amps—flowing through L5 and L10. The high-frequency ripple current can cause inductor core losses, since, with today's technology, very few (if not no) magnetic material (of which any inductor is made) can sustain such an extreme high-frequency ripple current.

Besides, the ripple current, if generated, would also flow through capacitors C1 and C2 (which are connected to L5 and L10 as integral parts of the pair of low pass filters, respectively). With today's technology, however, it is practically impossible to find capacitors that can handle this amount of ripple current. Furthermore, with the tightly coupled inductors L5 and L10, there also comes the leakage inductance thereof, which causes high-magnitude voltage spikes on both nodes A and B of the '309 amplifier. Such voltage spikes, even if controlled with a clamping circuit, will cause lots of energy wasted, thereby reducing the system efficiency. Thus, for the '309 amplifier, requiring a highly magnetically coupled pair of inductors L5 and L10 is a design deficiency.

The second design deficiency of the '309 power amplifier is that the '309 power amplifier can only drive a resistive type of load, but cannot drive a pure inductive type of load. In particular, under its design, the '309 amplifier does not provide storage as well as a return path for excess energy released (returned) from the inductive load. As a result, the '309 amplifier cannot drive a pure inductive type of load, such as a motor. This limitation severely restricts the usability of the '309 amplifier, and thus is also a design deficiency.

The third design deficiency of the '309 power amplifier is that its configuration in connection with MOSFET switches M1 and M2 cannot reliably ensure that only one of M1 and M2, but not both, is conducting at any moment. More specifically, the signals generated at the upper secondary winding are used as driver signals to drive switch M1 through diodes D142 and D143, both of which are biased in the reverse direction with respect to M1. As a skilled artisan appreciates, due to excessive charges accumulated on the driving gate of M1 resulting from the reverse-biasing of D142 and D143, M1 simply cannot be reliably turned off before or when M2 is turned on, resulting both switches being on at the same time for an extended length of time. This is a condition that can cause the secondary windings of the two switching transformers shorted and as a result render the '309 amplifier inoperable. The same situation also applies to switch M2. Thus, for the '309 amplifier, the present configuration in connection with switches M1 and M2 is yet another design deficiency.

The aforementioned design deficiencies of the '309 amplifier are primarily due to its failure to address issues arising from combining the aforementioned power-supplying stage and the power-amplifying stage into a single stage. These issues are usually not applicable to a conventional two-stage switching power amplifier.

Referring to FIG. 1D, which illustrates a conventional class D switching power amplifier 100, the power-amplifying, as shown, takes place on the secondary side of one or more transformers providing the required power supply. Typically, the power-amplifying circuit includes one set of four switches S101 to S104 connected to two low pass filters situated across load 150. As well known, each switch has an internal body-diode situated between its source and drain. Additionally, two filter capacitors C101 and C102 on the secondary side, which are integral parts of the power-supplying stage, are coupled to each of switches S101-S104 as well as coupled to positive and negative rails of a power supply (such as the secondary winding of a switching transformer).

In particular, the pair of inductors L101 and L102, to some extent, correspond to the pair of inductors L5 and L10 of the '309 amplifier, since both pairs of inductors are associated with a pair of low pass filters situated on both sides of load 150. Additionally, switches S102 and S104, to some extent, correspond to switches M1 and M2 of the '309 amplifier, since both pairs of switches are coupled to their respective pairs of low pass filters across load 150.

First, in a scenario similar to the one associated with the first design deficiency of the '309 amplifier—namely, the scenario where when S102 is turned off, the current flowing in inductor L101 is blocked by switch S101—the body diode D101 of switch S101 is conducted. As a result, the current of inductor L101 flows through body diode D101 to charge filter capacitor C101 and C102. As a skilled artisan appreciates, filter capacitors C101 and C102 work like an energy storage tank. As the inductor current keeps flowing through body diode D101 of power switch S101, the current keeps charging filter capacitors C101 and C102. As long as the capacitors are configured to have enough capacitance, excess energy can be stored therein, thus enabling the inductor current to continue to flow. This is different from the aforementioned situation of the '309 amplifier where the inductor current will stop flowing and cause high voltage spike at node A unless inductors L5 and L10 are tightly magnetically coupled. Therefore, unlike the '309 amplifier, conventional switching amplifier 100, in a similar situation, usually does not require that a tight magnetic coupling of inductors be present across load 150.

Next, in a scenario similar to the one associated with the second design deficiency of the '309 amplifier—namely, the scenario where there is considerable energy returned from a pure inductive load—capacitors C101 and C102 of conventional amplifier 100, as noted, provide storage as well as a current circulation path for excess energy returned from the pure inductive load. Thus, unlike the '309 amplifier, conventional switching amplifier 100 does not have an issue with regard to handling a pure inductive load.

In view of the differences in dealing with similar scenarios between the single-stage '309 amplifier and conventional two-stage switching amplifier 100, it should be apparent to a skilled artisan that those differences are mostly resulted from combining two stages into one stage. When the power-supplying stage and the power-amplifying stage are combined into one stage, capacitors C101 and C102—which, as shown in FIG. 1D, are parts of the power-supplying stage—may not be available in the newly combined single stage in a manner availed by a conventional switching amplifier. This is primarily because arrangements and availability with respect to switches on the secondary side of one or more switching transformers are changed with the stage-combining. As a result, new issues—such as not readily having a path for high-frequency inductor current when one switch is turned off, not readily having storage as well as a current circulation path for energy returned from a pure inductive load, and not readily having much flexibility in relative timings between switches—inevitably arise. As to the design of the '309 amplifier, these new issues are simply not adequately addressed, thus resulting in the aforementioned design deficiencies.

Therefore, in implementing a single-stage switch amplifier to increase system efficiency, there is a need to provide a new design distinct from and departing from that of the '309 amplifier in order to adequately new issues arising from combining two stages into one single stage while achieving the system efficiency advantage that comes with the stage-combining.

BRIEF SUMMARY

In one aspect, the present disclosure provides a single stage switching power amplifier that is designed in such a manner that the amplifier can afford to use a pair of individual inductors, rather than is forced to use a pair of tightly magnetically coupled inductors, in a pair of low pass filters situated across a load.

In another aspect, the present disclosure provides a single stage switching power amplifier comprising return-energy capture amplifier circuitries and energy flow-back circuitries, through which excess energy returned from the load is provided a return path to the primary side of the disclosed amplifier, thereby realizing bidirectional energy flow therein.

In yet another aspect, the present disclosure provides a single stage switching power amplifier comprising a spike-clamping circuit, which clamps voltage spikes at a pair of output nodes coupled to a respective pair of low pass filters situated across a load for providing an amplified differential output signal, stores the clamped energy, and recirculates the stored energy to power other one or more associated circuitries via, for example, an Aux power supply, thereby further increasing system efficiency.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which:

FIGS. 1A-C show an applicable schematic circuit diagram as well as applicable drawing figures of the '309 single-stage switching amplifier to illustrate design deficiencies thereof.

DETAILED DESCRIPTION

Figure 1D:
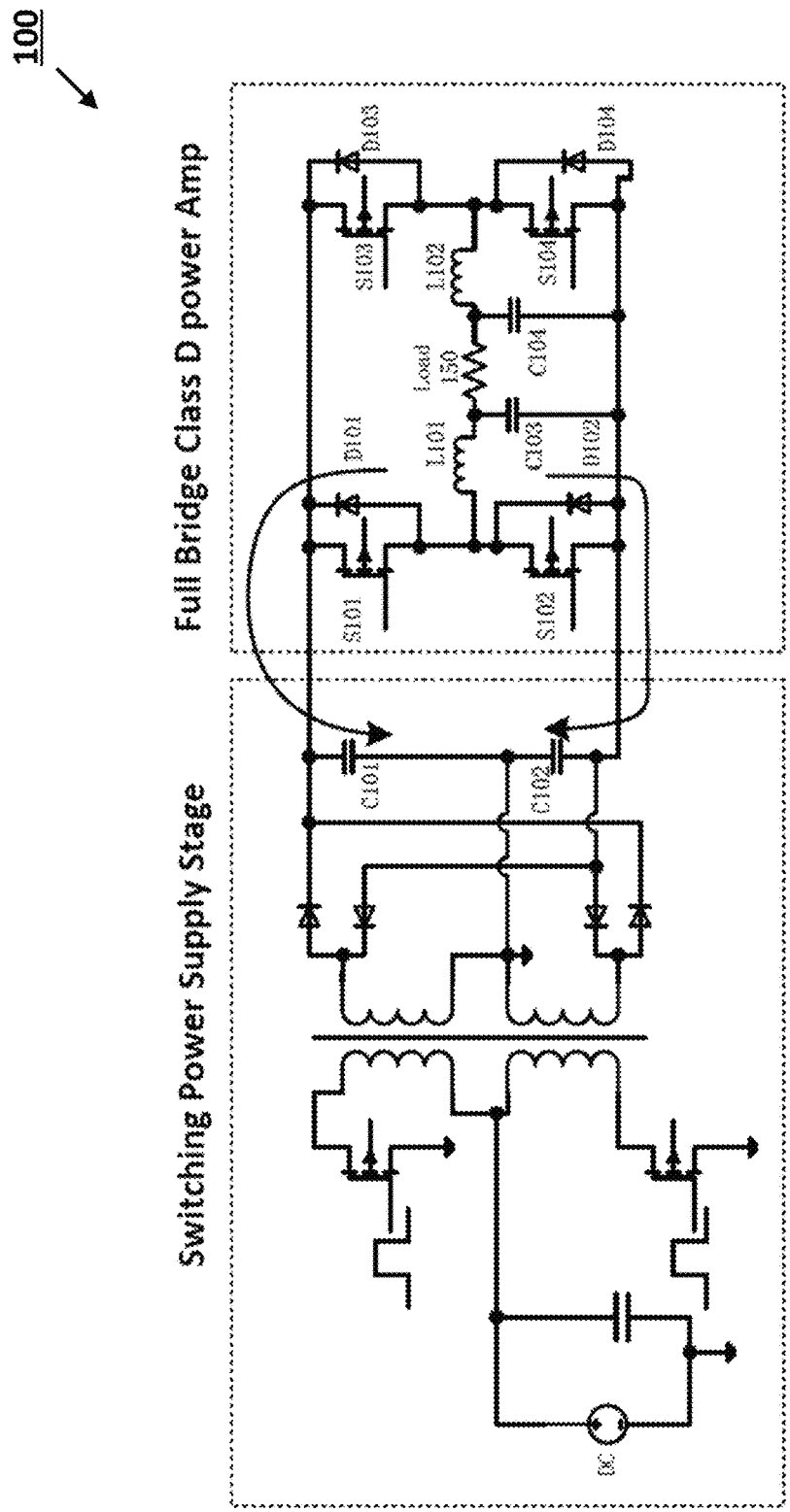
FIG. 1D shows a simplified schematic circuit diagram of a conventional class-D two-stage switching transformer to illustrate the causes of the design deficiencies of the '309 amplifier.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. Moreover, the use of the terms first, second, etc. do not denote any order or importance, but rather the terms first, second, etc. are used to distinguish one element from another.

Those of ordinary skill in the art will appreciate that the circuit components and basic configuration depicted in the following figures may vary. Other circuit components may be used in addition to or in place of the components depicted. The depicted example is not meant to imply architectural or other limitations with respect to the presently described one or more embodiments and/or the general disclosure.

Within the descriptions of the different views of the figures, the use of the same reference numerals and/or symbols in different drawings indicates similar or identical items, and similar elements can be provided similar names and reference numerals throughout the figure(s). If a reference numeral is once used to refer to a plurality of like elements, unless required otherwise by context, the reference numeral may refer to any, a subset of, or all of, the like elements in the figures bearing that reference numeral. The specific identifiers/names and reference numerals assigned to the elements are provided solely to aid in the description and are not meant to imply any limitations (structural or functional or otherwise) on the described embodiments.

In the description, relative terms such as "left," "right," "vertical," "horizontal," "upper," "lower," "top" and "bottom" as well as any derivatives thereof (e.g., "left side," "upper sub winding," etc.) should be construed to refer to the logical orientation as then described or as shown in the drawing figure under discussion. These relative terms are for convenience of description and are not intended to convey any limitation with regard to a particular orientation.

As used herein, the terms "instantaneous" and "instantaneously" refer to, with respect to time, that two event relating to a circuit occur substantially at the same time, or within a short time interval considered as not causing any undesirable or unintended consequence to a circuit operation.

As used herein, the terms "the primary side" and "the secondary side", in the context of a switching amplifier having two switching transformers as applicable to the present disclosure, refer to the unified primary side and the unified secondary side of both switching transformers, respectively, where the respective primary sides of both switching transformers can be considered one unified primary side and the respective secondary sides of both switching transformers can be considered one unified secondary side, wherein the unified primary side and the unified secondary side are considered isolated from each other with different electrical grounds.

As used herein, the terms "amplify", "amplification", "amplifying" and "amplified", in the context of signal amplification as applicable to the present disclosure, refer to and encompass both amplification and de-amplification of a signal level of a source input signal in either the same polarity or the opposite polarity of the source input signal. Similarly, as used herein, the term "gain", in the context of amplification of a signal, refers to both gain and attenuation.

As used herein, the terms "signal level", "input level" and other similar terms, in the context of signal modulation or amplification, unless otherwise specified with respect to a particular measurement characteristic, refer to any of voltage level, current level, power level and any combination thereof, as applicable.

For the ease of discussion, a reference numeral referring to a node may also be used to refer to the signal at the node when the term "signal" precedes the reference numeral. As an example, for node 3A, signal 3A refers to the signal at node 3A.

Figure 2:
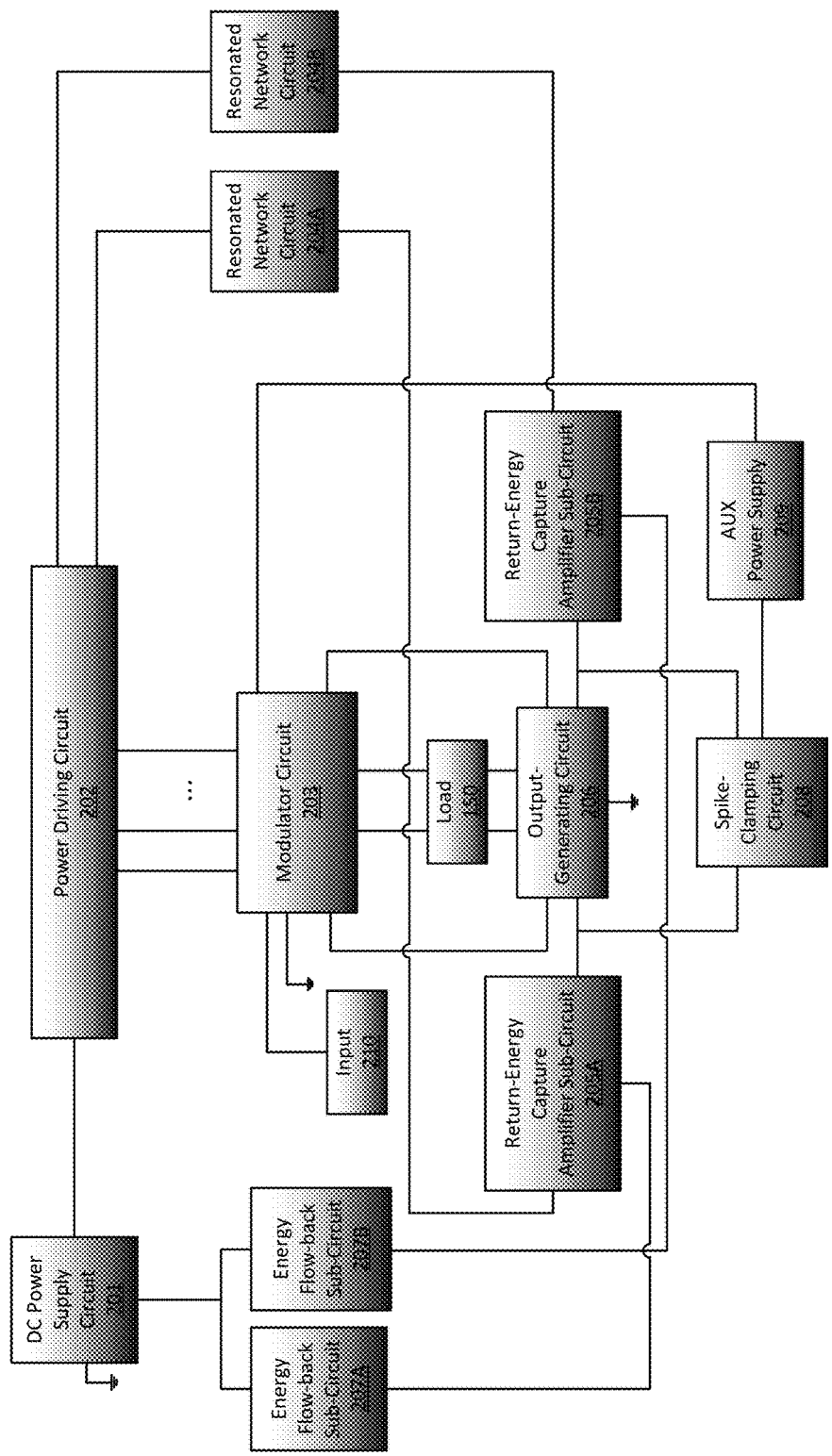
FIG. 2 is a functional diagram of an exemplary single stage switching amplifier, according to one or more embodiments of the present disclosure.

With reference now to the figures, and beginning with FIG. 2, there is illustrated a functional diagram of an exemplary single-stage switching amplifier 200, according to one or more embodiments of the present disclosure. Amplifier 200 comprises DC power supply circuit 201, power driver circuit 202, resonant network sub-circuits 204A and 204B (which collectively form resonant network circuit 204) and energy flow-back sub-circuits 207A and 207B (which collectively form energy flow-back circuit 207). From a topology standpoint, these components may be considered situated on the primary side of the switching transformers used in amplifier 200.

Amplifier 200 further comprises modulator circuit 203, return-energy capture amplifier sub-circuits 205A and 205B (which collectively form return-energy capture amplifier circuit 205), output generator circuit 206, spike-clamping circuit 208, and AUX power supply 209. From a topology standpoint, these components may be considered situated on the secondary side of the switching transformers used in amplifier 200. The primary-side components and the secondary-side components are configured to use respective grounds electrically isolated from each other.

DC power supply circuit 201 is configured to supply DC power to power driver circuit 202 while receive, store and recirculate energy captured by return-energy capture amplifier circuit 205 and flowing back to the primary side via energy flow-back circuit 207.

Power driver circuit 202 is configured to receive from modulator circuit 203 one or more carrier signals modulated with input signal 210, and output driver signals of equal duty cycle to drive two switching transformers in return-energy capture amplifier circuit 205. Power driver circuit 202 may receive additional ancillary signals, such as one or more reference signals and/or to facilitate the outputting of driver signals. Driver signals outputted by power driver circuit 202 may be fed into resonant network circuit 204 so as to achieve soft switching at substantially zero current or substantially zero voltage on the primary side.

Modulator circuit 203 is configured to receive input signal 210, and provide one or more carrier signals modulated with input signal 210 as well as optional ancillary signals to power driver circuit 202. Modulator circuit 203 is also configured to provide one or more control signals (which may be derived from input signal 210) to output generator circuit 206 to control, for example, applicable switches in output generator circuit 206 during generation of a differential output signal across load 150, so that certain otherwise undesirable risk can be eliminated or reduced. For example, in the case that output generator circuit 206 includes a pair of low pass filters used for generating the differential output signal, modulator circuit 203 may provide a pair of control signals to drive a corresponding pair of applicable switches for controlling the operation of the pair of low pass filters to ensure that only one of the two switches can be turned on at any moment, so that the risk of the secondary windings of the switching transformers (used for switching and amplifying) being shorted is eliminated or reduced. Optionally, modulator circuit 203 may be configured to additionally receive the different output signal as a feedback signal to achieve error correction.

Return-energy capture amplifier circuit (hereinafter simply referred to as "amplifier circuit") 205 is configured to amplify driver signals supplied by power driver circuit 202 and output signals that can be subsequently used to derive an output signal of amplifier 200 which is intended to be an amplified version of input signal 210. Further, amplifier circuit 205 is configured to capture excess energy returned from load 150 (hereinafter referred to as "return energy") in such a manner that the captured return energy can flow back to the primary side (for example, to DC power supply circuit 201) for potential re-use via energy flow-back circuit 207.

In one embodiment, amplifier circuit 205 comprises two symmetrical return-energy capture amplifier sub-circuits (hereinafter simply referred to as "amplifier sub-circuit(s)"), namely, amplifier sub-circuits 205A and 205B. Each amplifier sub-circuit is configured to amplify received driver signals and capture received return energy while provide one or more output signals that can be used for deriving an output signal of amplifier 200 which is an amplified version of input signal 210.

In one embodiment, power driver circuit 202, modulator circuit 203, amplifier circuit 205, and optionally resonant network circuit 204 work collectively so as to generate a pair of modulated carrier signals bearing a direct relationship to input signal 210, such that output generator circuit 206, after receiving the pair of modulated signals, can derive from the pair of modulated carrier signals a different output signal across load 150 which is an amplified replica of input signal 210.

Energy flow-back circuit 207 is configured to receive return energy captured by amplifier circuit 205 and provide a path for the return energy to flow back to the primary side for potential re-use (for example, by providing the return energy to be stored and circulated by DC power supply circuit 201), thereby enabling amplifier 200 to achieve bidirectional energy flow between the primary side and the secondary side.

Spike-clamping circuit 208 is configured to clamp the voltage spikes (e.g., caused by stray inductance in circuits or other stray elements), store the clamped energy, and circulate the stored clamped energy to power one or more other circuitries of amplifier 200 (such as to power modulator circuit 203) via Aux power supply 209 coupled thereto, thereby further increasing the system efficiency.

Figure 3:
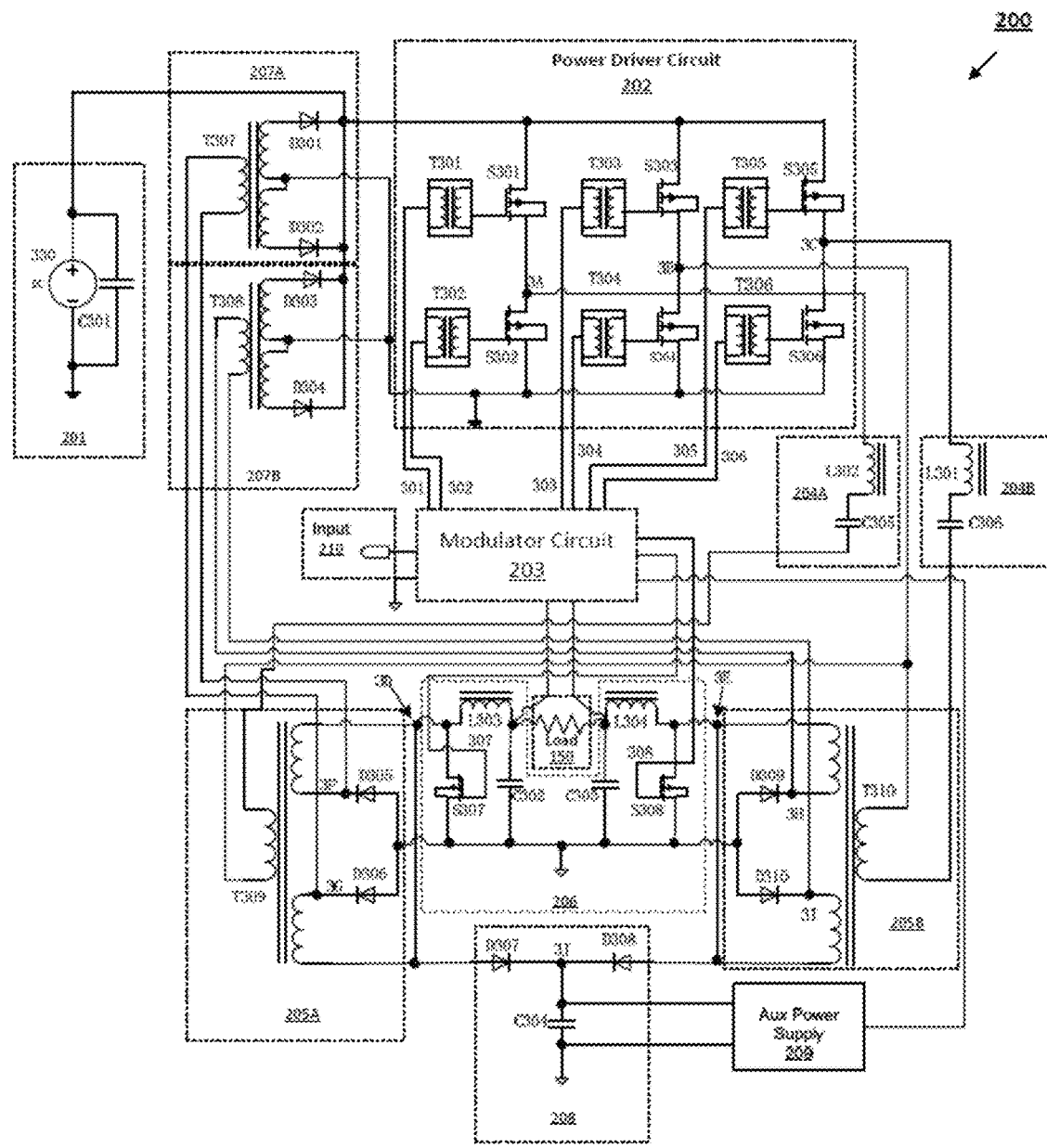
FIG. 3 is a simplified schematic circuit diagram illustrating an exemplary single stage switching amplifier, according to one or more embodiments of the present disclosure.

FIG. 3 is a simplified schematic circuit diagram illustrating an exemplary amplifier 200 according to one or more embodiments of the present disclosure. Referring to FIG. 3, in this embodiment, DC power supply circuit 201 comprises incoming DC power supply 330 and capacitor C301, which are in parallel connection with each other. With this configuration, capacitor C301 acts to store return energy flowing back from the secondary side via energy flow-back circuit 207 and also provide current circulation for the disclosed amplifier 200.

Power driver circuit 202 comprises six high-frequency isolation driver transformers T301-T306 and six high-frequency power MOSFET switches S301-S306, In particular, isolation driver transformers are used to isolate the ground of power driver circuit 202, which is on the primary side, from the ground of the secondary side. Each transformer is driven by a control signal supplied by modulator circuit 203 and outputs a resulting drive signal to drive a corresponding switch.

Switches S301-S306 form three ordered pairs (S301, S302), (S303, S304) and (S305, S306). As illustrated, for each switch pair, its first and second switches are electrically coupled to each other via a common connection node there-between, with the first switch being the upper switch and the second switch being the lower switch. Thus, switch pairs (S301, S302), (S303, S304) and (S305, S306) form their common connection nodes 3A, 3B and 3C, respectively, where output drive signals 3A, 3B and 3C used for driving switching transformers are generated. Correspondingly, driver transformers T301-T306 form three ordered pairs (T301, T302), (T303, T304) and (T305, T306). Thus, transformer pairs (T301, T302), (T303, T304) and (T305, T306), upon driven by three ordered pairs of pulse train signals (301, 302), (303, 304), (305, 306) supplied by modulator circuit 203, output corresponding drive signals to drive switch pairs (S301, S302), (S303, S304) and (S305, S306), respectively.

Figure 7:
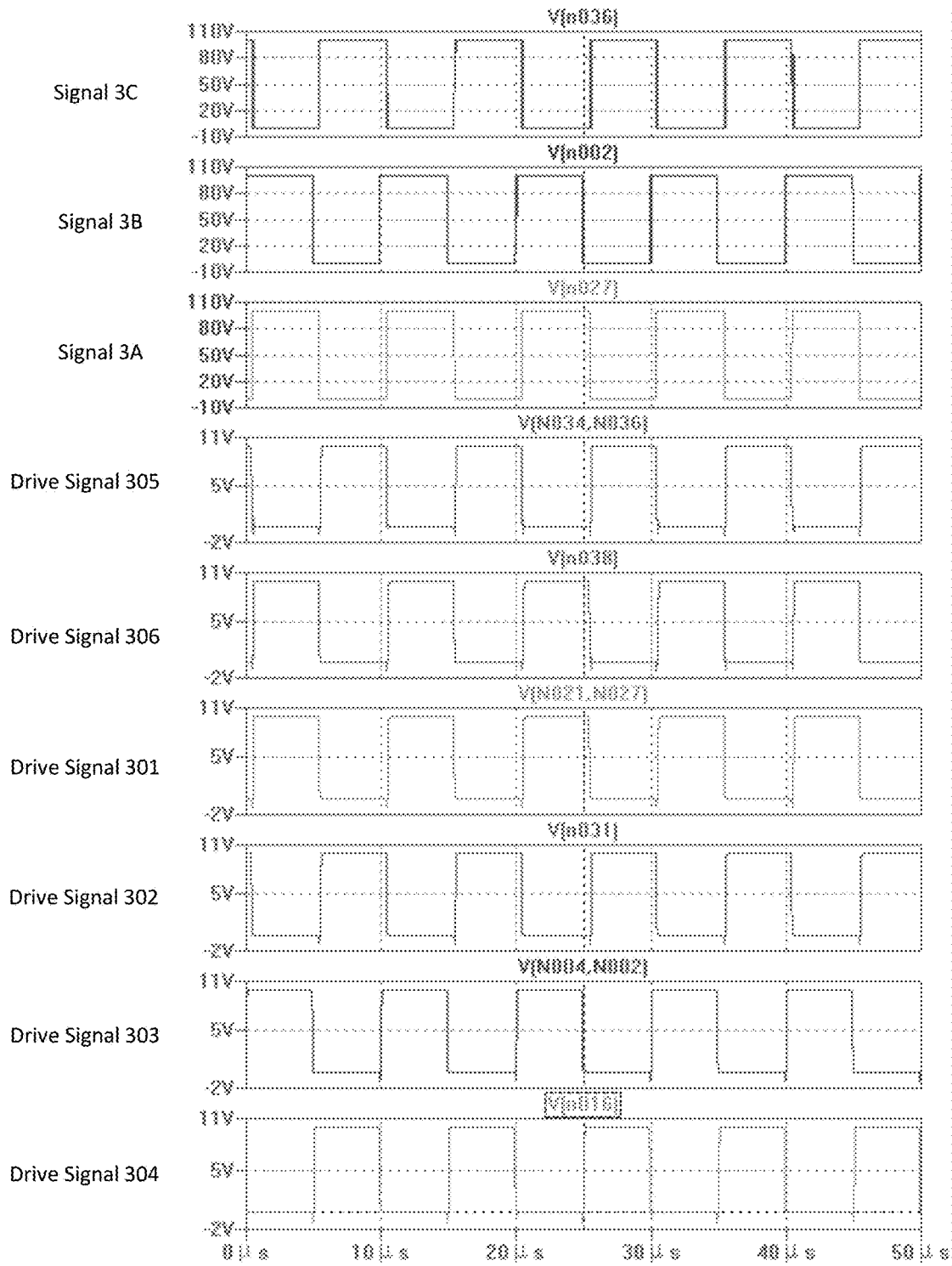
FIG. 7 illustrates exemplary waveforms of input drive signals and output drive signals of a power driver circuit, according to one or more embodiments of the present disclosure.

FIG. 7 illustrates exemplary waveforms of input drive signals 301-306 and waveforms of output drive signals 3A, 3B and 3C, according to one embodiment of the present disclosure. As shown, signals 301-306 are all equal 50% duty cycle square wave signals with the same frequency or fundamental frequency. For each signal pair of signal pairs (301, 302), (303, 304), (305, 306), the second signal is inverted from the first signal with respect to the common horizontal centerline of their respective waveforms. In particular, signal pairs (301, 302) and (305, 306) have the same pair of waveforms but in opposite orders. As well-known, the driver signal outputted by a driver transformer has the same waveform of the driver signal driving the driver transformer except that the amplitude of the former is stepped up (or stepped down) with respect to the amplitude of the latter. Thus, switches 301 and 306 are driven by a first set of same driving signals, while switches 302 and 305 are driven by a second set of same driving signals, with the two sets of driving signals inverted from each other with respect to the common horizontal centerline of their respective waveforms.

Signal pair (303 and 304) is a pair of carrier signals carrying information about input signal 210. More specifically, signal 304 is phase-shifted modulated (PSM) with input signal 210 with respect to reference signals 302 and 306, while signal 303 is inverted from signal 304 with respect to the common horizontal centerline of their respective waveforms.

With respect to phase shifted modulation, for illustration and not limitation, in this embodiment, the range of phase shifts used for modulation is between 1° and 179°, with a 90° phase shift representing a zero analog signal level, and 1° and 179° phase shifts used to modulate the maximum absolute signal levels in positive and negative polarities, respectively. As a skilled artisan appreciates, the range of phase shifts used for modulation may also be between, for example, 5° and 175° or 10° and 170°, depending on a preset level of phase shift granularity used for modulation.

Hence, the more positive (and thus the higher) a signed signal level is, the closer to 1° the phase shift (used to represent the signal level) is. Likewise, the more negative (and thus the lower) a signed signal level is, the closer to 179° the phase shift (used to modulate the signal level) is. Thus, the relationship between a signed signal level m and a phase shift α used to modulate the signal level can be defined by a signed modulation index k, which, in this embodiment, is the ratio between a signed signal level m and the maximum absolute signal level n. Specifically, the relationship between signed signal level m and phase shift α used to represent signal level m can be expressed as:

$$k = \frac{m}{n} = \frac{90 - \alpha}{90}.$$

The three transformer pairs (T301, T302), (T303, T304) and (T305, 306) drive the three switch pairs (S301, S302), (S303, S304) and (S305, S206) to generate, at common connection nodes 3A, 3B and 3C, signals 3A, 3B and 3C, respectively. As illustrated in FIG. 7, signals 3A, 3B and 3C are all pulse trains of equal 50% duty cycles. Signal 3B is a carrier signal phase-shifted with respect to reference signal 3A. Signals 3A and 3C are inverted from each other with respect to the common horizontal centerline of their respective waveforms, and therefore have a fixed relationship there-between. Thus, signals 3A and 3C may be viewed as reference signals to carrier signal 3B.

Compared to input driving signals 301-306 (driving driver transformers T301-T306), signals 3A-3C have the same frequency or fundamental frequency while having a stepped-up pulse amplitude due to the voltage step-up function of driver transformers T301-T306. Additionally, phase shifts (which are modulated with input signal 210) in carrier signal 3B is unchanged with respect to original PSM driver signal 304.

Accordingly, for power driver circuit 202, a set of six input signals 301-306 are transformed into a corresponding new set of three output signals 3A-3C, with the latter having the same frequency or fundamental frequency as that of the former, the carrier signal of the latter having the same phase shifts as those of the carrier signals of the former, and the latter having a stepped up pulse amplitude with respect to the former.

Returning to FIG. 3, resonant network circuit 204 includes resonant network sub-circuit 204A and resonant network sub-circuit 204B, each comprising a pair of an inductor and a capacitor tuned to achieve soft switching at substantially zero current at a node to which the resonant network sub-circuit is electrically coupled. In particular, resonant network sub-circuits 204A and 204B are coupled to nodes 3A and 3C, respectively. As noted, signals at nodes 3A and 3C, namely, signals 3A and 3C, are reference signals to carrier signal 3B. Thus, inductor L302 and capacitor C305 of resonant network sub-circuit 204A are tuned to achieve soft switching with respect to signal 3A, and inductor L301 and capacitor C306 of resonant network sub-circuit 204B are tuned to achieve soft switching with respect to signal 3B.

Return-energy capture amplifier circuit 205 includes two symmetrical return-energy capture amplifier sub-circuits 205A and 205B, each comprising a high-frequency isolation switching transformer for amplifying an input differential signal supplied to the primary winding thereof and the circuitry provided at the secondary winding thereof. In particular, isolation switching transformers are used in amplifier circuit 205 to isolate the ground of the primary side thereof from the ground of the secondary side thereof.

For amplifier sub-circuit 205A, the two terminals of the primary winding of its switching transformer T309 are electrically coupled to nodes 3A and 3B (via resonant network sub-circuit 204A), respectively. For amplifier sub-circuit 205B, the two terminals of the primary winding of its switching transformer T310 are electrically coupled to nodes 3B and 3C (via resonant network sub-circuit 204B), respectively. Thus, the input signals amplified by switching transformers T309 and T310 are the differential signals between signals 3A and 3B (hereinafter referred to as "signal (3A-3B)") and between signals 3B and 3C (hereinafter referred to as "signal (3B-3C)"), respectively.

Figure 8:
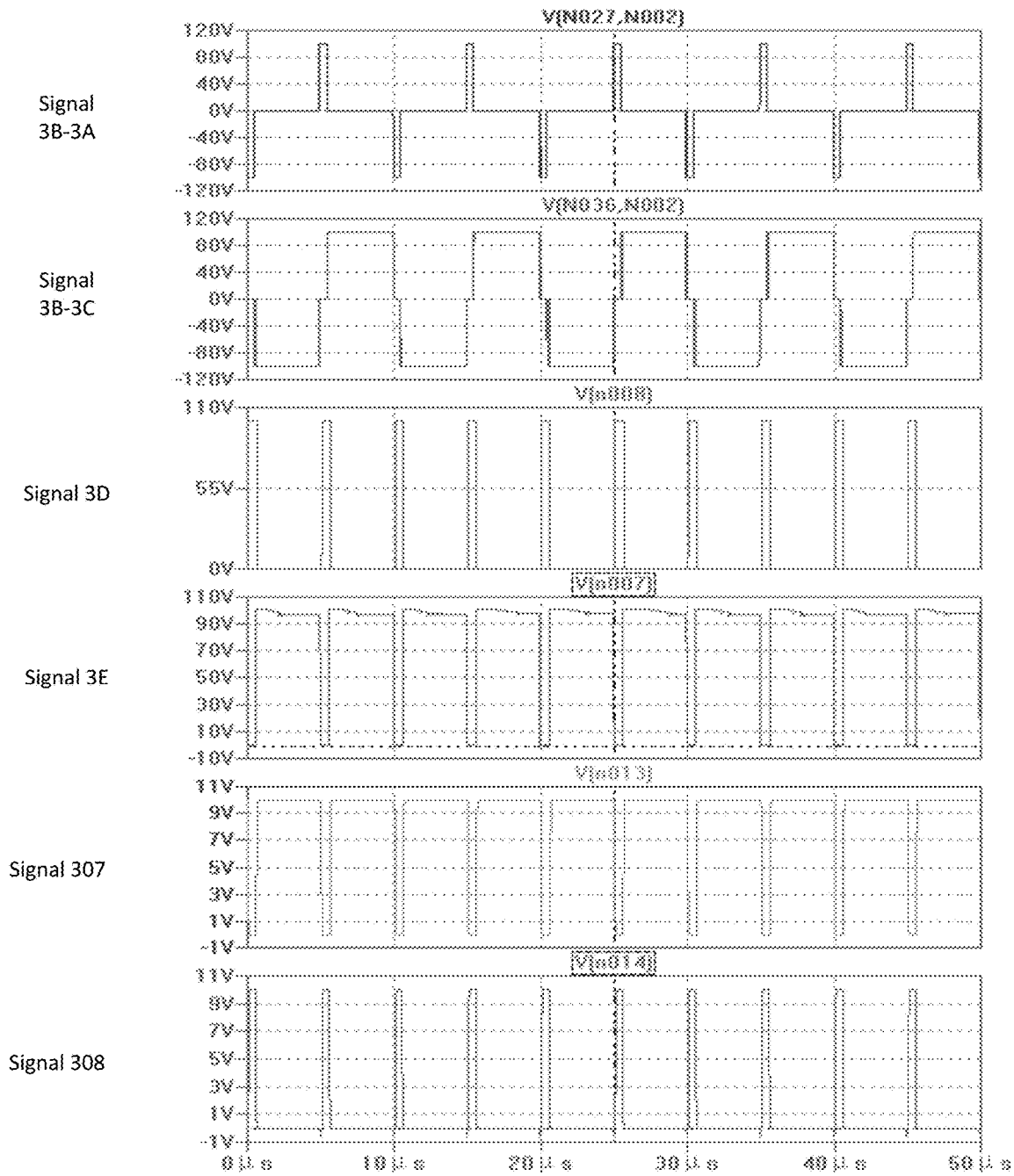
FIG. 8 illustrates exemplary waveforms of input and output signals of switching transformers as well as related control signals used in an output generator circuit, according to one or more embodiments of the present disclosure.

FIG. 8 illustrates, among other waveforms, exemplary waveforms of input signal (3A-3B) and signal (3B-3C). As noted, signal 3B is a carrier signal phase-shifted with respect to signal 3A. Thus, after signal subtraction, the phase shifts (in signal 3B), which are modulated with input signal 210, are transformed into corresponding positive and negative pulses in differential signal (3A-3B), with respective pulse widths carrying information about corresponding signal levels of input signal 210. More specifically, as a skilled artisan appreciates, a phase shift α in signal 3B is transformed into a corresponding pair of positive and negative pulses in signal (3A-3B), with each single pulse having a pulse width equivalent of duty cycle $$\frac{\alpha}{360} \times 100\%.$$

Thus, a smaller phase shift, which is used to represent a higher signed signal level, is transformed into a narrower pulse width and thus a lower duty cycle. Conversely, a bigger phase shift, which is used to represent a lower signed signal level, is transformed into a wider pulse width and thus a higher duty cycle. Similarly, with signal 3C being inverted from signal 3A with respect to the common horizontal centerline of their respective waveforms, after signal subtraction, phase shifts (in signal 3B) are transformed into positive and negative pulses in differential signal (3B-3C), with respective pulse widths likewise carrying information about corresponding signal levels of input signal 210. Thus, the same phase shift α in signal 3B is transformed into a corresponding pulse width of duty cycle $$\frac{180 - \alpha}{360} \times 100\%$$

in signal (3B-3C).

Comparing the waveforms of signals (3A-3B) and (3B-3C), during each fundamental half cycle, respective pulses of signals (3A-3B) and (3B-3C), which are of opposite polarities, alternate with respect to each other. As a skilled artisan appreciates, this fixed relationship is not coincidental. It is due to that signal 3C is inverted from signal 3A with respect to the common horizontal centerline of their respective waveforms.

As well-known, switching transformers T309 and T310 amplify their input signals by producing amplified signals on their secondary windings based on their turns ratios, respectively. In this embodiment, the respective turns ratio of their respective switching transformers T309 and T310 are identical to each other. For switching amplifier 200, given a fixed incoming DC power supply 330 of power supply circuit 201, switching transformers T309 and T310 are the only components where signal amplifications take place. Accordingly, given a fixed incoming DC power supply 330, the signal gain of output differential signal 211 across load 150 with respect to input signal 210 only depends on the turns ratio of switching transformers T309 and T310.

For each amplifier sub-circuit, the circuitry on the secondary winding of its switching transformer is configured to not only function as a full wave rectifier for subjecting the amplified signal generated on the secondary winding to full wave rectification with respect to an output node, but also capture excess energy returned from output generator circuit 206 (which, for example, can be excess energy returned from load 150 or returned from one or more inductors in output generator circuit 206).

Specifically, for each amplifier sub-circuit, the secondary winding of its switching transformer is a split winding having an upper sub winding and a lower sub winding. The lower terminal of the upper sub winding and the upper terminal of the lower sub winding are each electrically coupled to the cathode of a rectifier diode whose anode is coupled to ground. Moreover, both the upper terminal of the upper sub winding and the lower terminal of the lower sub winding are electrically coupled to an output node of the amplifier sub-circuit. Thus, in the case of amplifier sub-circuit 205A, nodes 3F and 3G are coupled to the cathodes of rectifier diodes D305 and D306, respectively, while the output node is node 3D. Likewise, in the case of amplifier sub-circuit 205B, nodes 3H and 3I are coupled to the cathodes of rectifier diodes D309 and D310, while the output node is node 3E. With this secondary winding configuration, each amplifier sub-circuit achieves signal switching and amplification for ultimately producing an amplified output signal across load 150 in a single stage.

In one aspect, the secondary winding circuitry acts as a full wave rectifier for rectifying an amplified signal (generated on the secondary winding) with respect to an output node. Using amplifier sub-circuit 205A as an example, with both the upper terminal of the upper sub winding and the lower terminal of the lower sub winding electrically coupled to node 3D, pulse current is generated to flow through node 3D in one direction towards output generator circuit 206. With the split secondary winding and the manner in which diodes D305 and D306 are connected, diodes D305 and D306 are forced to be biased in the reverse direction. Thus, pulses of both positive and negative polarities of input signal (3A-3B) of the primary winding, after being amplified and subject to the secondary winding circuitry, are all converted to corresponding pulses of positive polarity at output node 3D. Accordingly, the secondary winding circuitry of amplifier sub-circuit 205A acts as a full wave rectifier for rectifying the amplified signal generated on the secondary winding with respect to node 3D. Similarly, the secondary winding circuitry of amplifier sub-circuit 205B acts as a full wave rectifier for rectifying an amplified signal (generated on the secondary winding) with respect to output node 3E.

FIG. 8 also illustrates corresponding waveforms of signals at nodes 3D and 3E, which are the respective output nodes of amplifier sub-circuits 205A and 205B. With reference to the waveform of signal (3A-3B), signal 3D, as shown, is an amplified and full wave rectified version of signal (3A-3B), with a gain in pulse amplitude determined by the turns ratio of transformer T309. Thus, compared to signal (3A-3B), signal 3D has a fundamental frequency doubling that of signal (3A-3B). Or putting it differently, after the amplified signal at the secondary winding is subject to the full wave rectifier circuitry there-at, the fundamental period of signal 3D becomes half of that of signal (3A-3B). Likewise, signals 3E is an amplified and full wave rectified version of signal (3B-3C), with the gain in pulse amplitude determined by the turns ratio of transformer T310. Similarly, the fundamental period of signal 3E is half of that of input signal (3B-3C) while the fundamental frequency of signal 3E is twice that of signal (3B-3C).

Since the respective turns ratios of transformer T309 and T310 are identical, the pulse amplitude of signal 3D matches that of signal 3E. Since signal (3A-3B) and signal (3B-3C) have the same fundamental frequency (which is the frequency of signal 3A) and the fundamental frequencies of signals 3D and 3E double those of signals (3A-3B) and (3B-3C), respectively. signals 3D and 3E also have the same fundamental frequency. Likewise, signals 3D and 3E have the same fundamental period, which is half of that of signals (3A-3B) and (3B-3C).

Furthermore, during each fundamental half cycle, respective pulses of signals (3A-3B) and (3B-3C) of opposite polarities alternate with respect to each other. On the other hand, pulses of both positive and negative polarities of signals (3A-3B) and (3B-3C) are converted to corresponding pulses of positive polarity of signals 3D and 3E, respectively. Thus, signals 3D and 3E are carrier signals with unequal duty cycles corresponding to phase shifts in signal 3B used to modulate input signal 210. The conversion also causes the fundamental period of signals 3D and 3E, as noted, to be half of that of signals (3A-3B) and (3B-3C). As a result, during each fundamental cycle of signals 3D and 3E, the respective pulses of signals 3D and 3E of the same polarity alternate with respect to each other, Accordingly, for each fundamental cycle, due to the doubling of fundamental frequency from signals (3A-3B) and (3B-3C), the duty cycles of single pulses of signals 3D and 3E are doubled from $$\frac{\alpha}{360}$$

and $$\frac{180-\alpha}{360}$$

(which, as noted above, are the respective duty cycles of single pulses in signals (3A-3B) and (3B-3C)) to $$\frac{\alpha}{180} \times 100\%$$

and $$\frac{180-\alpha}{180} \times 100\%,$$

respectively. Thus, for each fundamental cycle, the duty cycles of signals 3D and 3E are complementary to each other in that the sum of the two duty cycles is equal to 100%.

Turning to another aspect of the secondary winding circuitry of each amplifier sub-circuit, the circuitry captures excess energy returned from load 150 by realizing flowing back of current (resulted from return energy) to the primary side via an energy flow-back sub-circuit. Using the secondary winding circuitry of amplifier sub-circuit 205A as an example, the cathodes of diodes D305 and D306 are coupled to nodes 3F and 3G, which are electrically coupled to output generator circuit 206 through the upper and lower sub windings via node 3D. Output generator circuit 206 is configured to conduct energy returned from both sides of load 150 (through, for example, inductors thereof) back to amplifier circuit 205 via nodes 3D and 3E, respectively. So on one side of load 150, energy returned from load 150 flows from output generator circuit 206 to nodes 3F and 3G via node 3D.

On the other hand, anodes of diodes D305 and D306 are coupled to ground. Thus, the return energy conducted back to nodes 3F and 3G causes diodes D305 and D306 to be biased in the reverse direction, forcing nodes 3F and 3G to build up the peak-to-peak differential voltage there-between to a level above a normal threshold level of peak-to-peak differential voltage there-between. This in turn causes current to flow back to the primary side via energy flow-back sub-circuit 207A, thereby achieving flowing back of return energy to the primary side.

Likewise, the secondary winding circuitry of amplifier sub-circuit 205B also captures excess energy returned from the other side of load 150 by achieving flowing back of the return energy to the primary side via energy flow-back sub-circuit 207B.

Figure 4A:
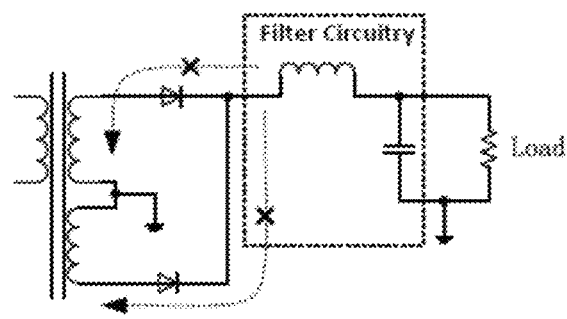
FIGS. 4A-B are simplified schematic circuit diagrams illustrating distinctions between a full wave rectifier of the power-supplying stage used in a conventional class D two-stage switching power amplifier and similarly used in the '309 amplifier, and the full wave rectifier of an return-energy capture amplifier sub-circuit used in the disclosed switching power amplifier 200, according to one or more embodiments of the present disclosure.
Figure 4B:
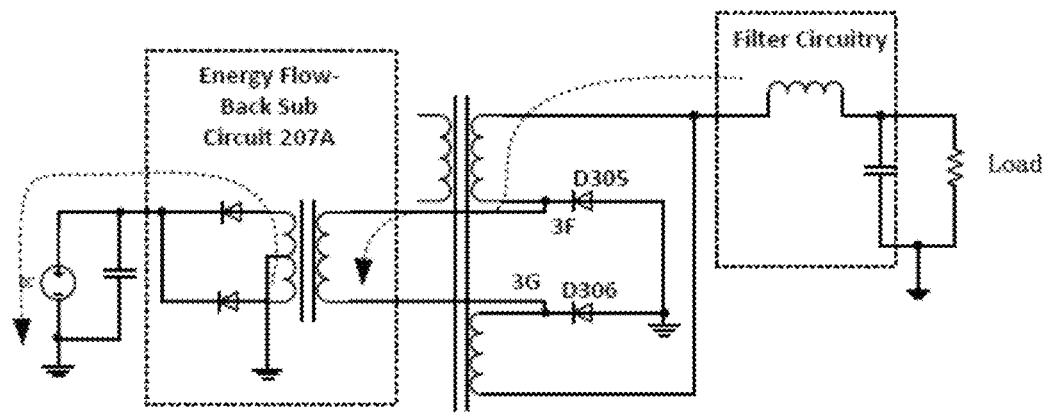

FIGS. 4A-B are simplified schematic circuit diagrams illustrating distinctions between a full wave rectifier of the power-supplying stage used in a conventional class D two-stage switching power amplifier (and similarly used in the '309 amplifier) and a full wave rectifier used in an return-energy capture amplifier sub-circuit used in switching power amplifier 200. As illustrated in FIG. 4A, in the power-supplying stage of a conventional class D switching power, the full wave rectifier on the secondary side of its switching transformer is formed by having a center-tapped secondary winding as well as placing two diodes at the two ends of the secondary winding. The center-tap of the secondary winding is coupled to ground. The anodes of the two diodes coupled to the two ends of the secondary winding, respectively. The cathodes of the two diodes are coupled to each other to form an input node of the filter circuitry coupled to a load. Such a full wave rectifier configuration cannot realize bidirectional energy flow by allowing return energy to flow back to the primary side of the conventional switching amplifier.

On the other hand, as illustrated in FIG. 4B, the full wave rectifier of an return-energy capture amplifier sub-circuit, such as amplifier sub-circuit 205A, is formed by having a split secondary winding at the secondary side of its switching transformer T309 and placing two diodes D305 and D306 on the lower end of the upper sub winding and the upper end of the lower sub winding (namely, nodes 3F and 3G), respectively, with the cathodes of the two diodes coupled to the aforementioned two ends of the two sub windings, respectively. As noted, this full wave rectifier configuration also allows the amplifier sub-circuit to capture return energy. Additionally, the two coupled ends of the two sub windings which 3F and 3G are electrically coupled to an energy flow-back sub-circuit (which, in this case, is energy flow-back sub-circuit 207A), thus enabling bidirectional energy flow by providing a path for the captured return energy to flow back to the primary side of switching amplifier 200. Accordingly, the distinctions between the two full wave rectifiers respectively shown in FIGS. 4A and 4B are apparent.

Returning to FIG. 3, output generator circuit 206 comprises a pair of low pass filters across load 150 and a pair of switches (which may be MOSFET switches), with each switch connected in parallel with the one low pass filter situated on the same side of load 150. Each low pass filter comprises a pair of an inductor and a capacitor with one end of the inductor coupled to an input node of output generator circuit 206, one end of the capacitor coupled to ground, and a common end of the two serving as one of the two terminals of load 150. Thus, the low pass filter on the left side of load 150 comprises inductor L303 and capacitor C302 with the left end of L303 coupled to input node 3D (which simultaneously serves as an output node of amplifier sub-circuit 205A), the lower end of C302 coupled to ground, and the common end of L303 and C302 serving as the left terminal of load 150. Similarly, the low pass filter on the right side of load 150 comprises inductor L304 and capacitor C303 with the right end of L304 coupled to input node 3E (simultaneously serving as an output node to amplifier sub-circuit 205B), the lower end of C303 coupled to ground, and the common end of L304 and C303 serving as the right terminal of load 150. The left side switch S307 is connected in parallel with the left side low pass filter, with the upper end coupled to the left end of inductor L303 as well as input node 3D and the lower end coupled to the lower end of capacitor C302 and ground. Similarly, the right side switch S308 is connected in parallel with the right side low pass filter, with the upper end coupled to the right end of L304 as well as input node 3E and the lower end coupled to the lower end of C303 and ground.

As will be described below, there are at least three aspects associated with the above-described configuration (hereinafter referred to as "the filter configuration") in connection with the two low pass filters and the two switches.

In the first aspect, the filter configuration, in conjunction with control signals 307 and 308 supplied by modulator circuit 203, ensures that only one of switches S307 and S308 is turned on at any moment during operation, thus eliminating or reducing the likelihood of secondary windings of switching transformers being shorted. Specifically, switches S307 and S308 are driven by control signals 307 and 308 supplied by modulator circuit 203. Referring back to FIG. 8, the waveform of signal 308 (used to turn on or off switch S308) is similar to the waveform of signal 3D except for the difference in pulse amplitude. Likewise, the waveform of signal 307 (to turn on or off switch S307) is similar to the waveform of signal 3E except for the difference in amplitude. Thus, signal 308 tracks and follows signal 3D in terms of going high or low, and signal 307 tracks and follows signal 3E in terms of going high or low. As noted, the respective pulses of signals 3D and 3E alternate with respect to each other. Thus, likewise, signals 308 and 307 also alternate with respect to each other, resulting in switches S308 and S307 being switched on and off alternately. Accordingly, only one of switches S307 and S308 are switched on or off at a time during an operation of switching amplifier 200, thus eliminating or reducing the likelihood of the secondary windings being shorted. This advantage is in direct contrast to the aforementioned third design deficiency of the '309 amplifier, with which the '309 amplifier cannot ensure that only one of secondary side switches M1 and M2 is on at any moment. Thus, from this perspective, it can be seen that the design of the disclosed amplifier 200 is quite distinct from the design of the '309 amplifier.

In the second aspect, the filter configuration enables the functioning of low pass filters on both sides (with respect to load 150) in filtering out two output signals from two input signals 3D and 3E based on their respective unequal duty cycles. In operation, pulses of signal 3D and 3E alternate with respect to each other, when signal 3D goes high, signal 3E goes low, and vice versa. As signal 3D goes high, signal 308 goes high as well, resulting switch S308 being turned on. In the meantime, since the signal 3E goes low (as signal 3D goes high), signal 307 goes low as well, resulting switch S307 being turned off. Thus, as signal 3D goes high, switch S308, which is on the opposite side of node 3D with respect to load 150, is turned on, while switch S307, which is on the same side of node 3D with respect to load 150, is turned off. As a result, current flowing from node 3D flows through load 150 to ground via the turned-on switch S308. This enables the functioning of the left-side low pass filter in filtering out a low-frequency output signal from the high-frequency input signal 3D based on unequal duty cycles thereof. Similarly, when signal 3E goes high (as signal 3D goes low), switch S307, which is on the opposite side of node 3E with respect to load 150, is turned on, while switch S308, which is on the same side of node 3E with respect to load 150, is turned off. As a result, current flowing from node 3E flows through load 150 to ground via the turned-on switch S307. This similarly enables the functioning of the right-side low pass filter in filtering out a low-frequency output signal from high-frequency input signal 3E based on unequal duty cycles thereof.

Thus, with the alternating relationship between signals 3D and 3E, the dynamics of switches S308 and S307 (as resulted from the use of alternating control signals 308 and 307) enables the functioning of the low pass filters on both sides (with respect to load 150) in filtering out two output signals from two input signals 3D and 3E based on their unequal duty cycles, respectively.

In the third aspect, the filter configuration, working in concert with the rest of switching amplifier 200, results in output differential signal 211 (across load 150) being an amplified replica of input signal 210. Specifically, as noted above, a phase shift α in carrier signals 3B and 304 is transformed into duty cycles of signals 3D and 3E at $$\frac{\alpha}{180} \times 100\%$$

and $$\frac{180 - \alpha}{180} \times 100\%$$

(during two consecutive fundamental cycles thereof), respectively. As well-known, the ratio between a signal level of an output signal of a low pass filter and the maximum absolute signal level of the output signal is equal to the duty cycle in the input carrier signal of the low pass filter. Thus, for signed signal level m of input signal 210, the ratio between the resulting signed output signal level M of output differential signal 211—which is the differential signal between the two output signals filtered out of signals 3D and 3E, respectively—and the maximum absolute output level N—namely, $$\frac{M}{N}$$

is equal to the signed difference between the corresponding duty cycles of signals 3D and 3E, which is equal to $$\frac{180-\alpha}{180} - \frac{\alpha}{180} = \frac{90-\alpha}{90}.$$

That is, output signed signal level M (which corresponds to signed signal level m) has the same ratio with respect to the maximum absolute output level N as the ratio which input signal level m has with respect to the maximum absolute signal level n. By definition, maximum signal level N is an amplified version of maximum signal level n (with the level of amplification determined by the turns ratio of two switching transformers of amplifier circuit 205). Therefore, output signal level M is an amplified version of input signal level m. Thus, when input signal 210 and differential signal 211 are each considered as a whole (assuming that input signal 210 is adequately sampled as related to the fundamental frequency of, for example, the original input PSM signal 304 of power driver circuit 202), differential signal 211 generated across load 150 is an amplified replica of input signal 210. Accordingly, the filter configuration results in output differential signal 211 (across load 150) being an amplified replica of input signal 210.

Additionally, the pair of inductor L303 and capacitor C302 of the left side low pass filter and the pair of inductor L304 and capacitor C303 of right side low pass filter are each configured to generate a same corner frequency suitable for filtering out high-frequency components of input carrier signals 3D and 3E, respectively. Typically, the corner frequency is lower than the fundamental frequency of signals 3D and 3E while higher than the upper frequency of input signal 210. In one embodiment, the corner frequency of each low pass filter is set as $2x$ the upper frequency of input signal 210.

Turning to energy flow-back circuit 207, energy flow-back circuit 207 includes energy flow-back sub-circuits 207A and 207B, which, as illustrated, are coupled to amplifier sub-circuits 205A and 205B, respectively. For ease of discussion, from now on, nodes 3F and 3G of amplifier sub-circuit 205A and nodes 3H and 3I of amplifier sub-circuit 205B will each be referred to as an "energy return node". Thus, nodes 3F and 3G will be referred to as a pair of energy return nodes of amplifier sub-circuit 205A. In the same token, nodes 3H and 3I will be referred to as a pair of energy return nodes of amplifier sub-circuit 205B. Each energy flow-back sub-circuit is configured to provide an energy flow path for return energy (captured by its coupled amplifier sub-circuit) to flow back to the primary side, such that when the peak-to-peak differential voltage between a pair of energy return nodes goes above a normal threshold level, a current starts to flow back to the primary side from the pair of energy return nodes.

Specifically, each energy flow-back sub-circuit comprises a transformer and two diodes. The two terminals of the primary winding of the transformer are electrically coupled to the pair of energy return nodes of its coupled amplifier sub-circuit. The secondary winding of the transformer is center-tapped with the center tap coupled to ground. Each of the two diodes has its anode coupled to one end of the secondary winding and its cathode coupled to DC power supply circuit 201 and power driver circuit 202. This two-diode configuration forms a full wave rectifier which allows received return energy to flow back to DC power supply circuit 201 and be circulated back to power driver circuit 202 and ultimately to load 150. Thus, energy flow-back sub-circuit 207A comprises transformer T307 and diodes D301 and D302, with the two terminals of transformer T307 coupled to nodes 3F and 3G of amplifier sub-circuit 205A, and diodes D301 and D302 forming a full wave rectifier. Likewise, energy flow-back sub-circuit 207B comprises transformer T308 and diodes D303 and D304, with the two terminals of transformer T308 coupled to 3H and 3I of amplifier sub-circuit 205B, and diodes D303 and D304 forming a full wave rectifier.

An energy flow-back sub-circuit is configured to have current (and thus energy) start to flow back from the amplifier sub-circuit to the primary side when the peak-to-peak differential voltage between the pair of energy return nodes of the coupled amplifier sub-circuit goes above a preset threshold voltage level. In this embodiment, the threshold voltage level may be set in advance based on parameters, such as the voltage of incoming DC power supply 330 of DC power supply circuit 201 and the turns ratio of the isolation switching transformer of the coupled amplifier sub-circuit. In particular, as part of the configuration of an energy flow-back sub-circuit, the turns ratio of the transformer used therein (such as transformer T307 or T308) is dependent on the pulse amplitude of the signal outputted by the coupled amplifier sub-circuit. The pulse amplitude, in turn, is dependent on the turns ratio of the isolation switching transformer of the amplifier sub-circuit as well as the voltage of incoming DC power supply 330.

For illustration and not limitation and using energy flow-back sub-circuit 207A as an example, if DC power supply 330 supplies 100V and the turns ratio of isolation transformer T309 of amplifier sub-circuit 205A (to which energy flow-back sub-circuit 207A is coupled) is 1:1, then the differential voltage at the primary side of isolation transformer T309 reaches 200V peak-to-peak pulse voltage. This results in the pulse amplitude of the signal at node 3D (as outputted by amplifier sub-circuit 205A) being 100V and the normal differential voltage across nodes 3F and 3G being 400V peak-to-peak. The 400V peek-to-peek value can then be set as the threshold level to start current flowing back from amplifier sub-circuit 205A to the primary side.

The turns ratio of transformer T307 of energy flow-back sub-circuit 207A can in turn be set to 2:1 so as to realize that current starts to flow back from amplifier sub-circuit 205A when the differential voltage across nodes 3F and 3G goes above 400V peak-to-peak as a result of return energy. As illustrated, the two terminals of the primary winding of transformer T307 are coupled to nodes 3F and 3G. Thus, with the 2:1 turns ratio set at transformer T307, when the differential voltage across nodes 3F and 3G goes above 400V peak-to-peak, the differential voltage induced across the two ends of the secondary winding of transformer T307 goes above 200V peak-to-peak, generating a rectified output voltage of 100V by the full wave rectifier. With the 100V voltage generated by the full wave rectifier, energy flow-back sub-circuit 207A starts to conduct current (and thus energy) back to, for example, DC power supplier circuit 201 which supplies 100V, thereby creating a condition that allows current to start to flow back from amplifier sub-circuit 205A to the primary side.

As a skilled artisan readily appreciates, the above-described exemplary configuration of energy flow-back sub-circuit 207A—which is for realization of flowing back of current from amplifier sub-circuit 205A when the peak-to-peak differential voltage across nodes 3F and 3G goes above a threshold level as a result of return energy—can be adjusted or modified accordingly, depending on, for example, changes in respective values of relevant parameters, such as the voltage of an incoming DC power supply and the turns ratio of switching transformer T309.

In the same token, energy flow-back sub-circuit 207B, which has the same configuration as that of energy flow-back sub-circuit 207A, similarly realizes flowing back of current from amplifier sub-circuit 205B when the peak-to-peak differential voltage across nodes 3H and 3I goes above a threshold level resulting from return energy.

Figure 9:
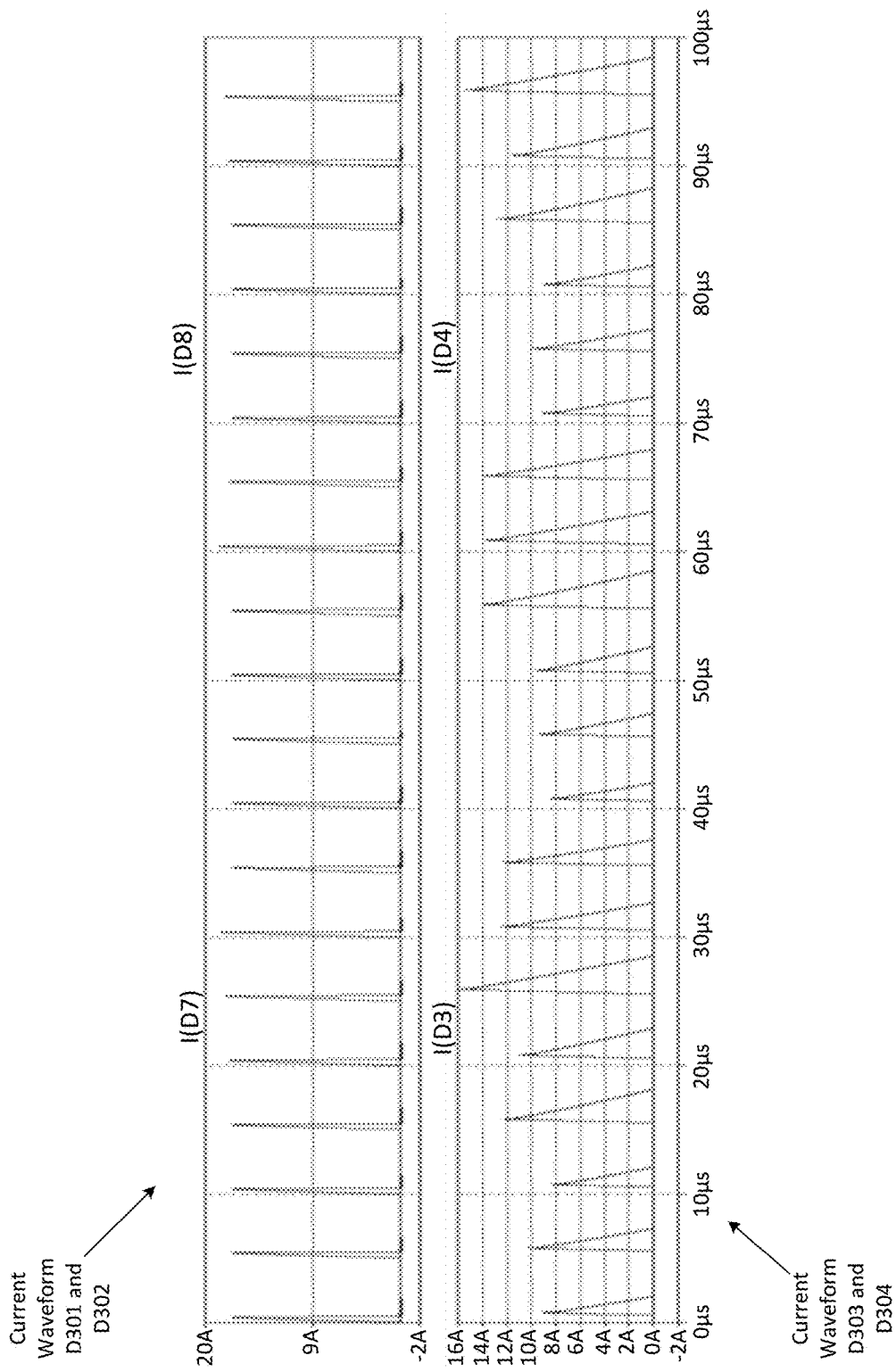
FIG. 9 illustrates exemplary waveforms of two pairs of diodes of two respective energy flow-back sub-circuits each providing a flow-back path for energy returned from one side of the load of switching transformer 200, according to one or more embodiments of the present disclosure.

FIG. 9 illustrates exemplary waveforms of diodes D301 and D302 of energy flow-back sub-circuit 207A and waveforms diodes D303 and D304 of energy flow-back sub-circuit 207B. In particular, energy flow-back sub-circuits 207A and 207B provide energy flow-back paths for energy returned from nodes 3D and 3E (which are situated on opposites sides of load 150), respectively. For signals 3D and 3E, their respective pulses alternate with respect to each other while their respective duty cycles are complementary to each other. These relationships between signals 3D and 3E are reflected in the illustrated relationships between current spikes of diodes D301 and D302 and current spikes of diodes D303. More specifically, current spikes of diodes D301 and D302 and current spikes of diodes D303 and D304, which both go as high as 18A (in the above exemplary embodiment where the turns ratio for transformers T307 and T308 is 2:1), alternate with each other, with their respective durations complementary to each other within each fundamental cycle.

Specifically, the configurations of amplifier circuit 205, energy flow-back circuit 207 and output generator circuit 206 adequately address the two aforementioned new issues arising from combining two stages into one stage, as previously mentioned in connection with discussion on the '309 power amplifier.

First, as noted, one new issue arising from the stage-combining is that a single-stage amplifier may not readily have a path for high-frequency inductor current to flow when one secondary side switch is turned off. Related to this issue, the '309 amplifier is forced to require that its inductors L5 and L10 being highly magnetically coupled with the coupling coefficient being better than 0.99. With the configurations of amplifier circuit 205, energy flow-back circuit 207 and output generator circuit 206, when, for example, switch S307 is turned off, node 3D, which couples to one end of inductor L303, conducts current flowing from inductor L303 to the pair of energy return nodes of amplifier circuit 205A (namely, nodes 3F and 3G). As described, nodes 3F and 3G are coupled to energy flow-back sub-circuit 207A, which provides a path for current reaching nodes 3F and 3G to flow back to the primary side (where DC power supply circuit 201 provides energy storage and a circulation path for the flow-back current). Similar situation occurs with respect to current flowing from inductor L304 when switch S308 is turned off. Thus, the disclosed switching amplifier 200 provides a path to high-frequency current when one switch on the secondary side is turned off, thereby adequately addressing this new issue arising from the stage-combining. Accordingly, unlike the '309 amplifier, the disclosed switching amplifier 200 does not require that its corresponding pair of inductors L303 and L304 be highly magnetically coupled.

Second, as noted, another new issue arising from the stage-combining is that a single-stage amplifier may not readily have storage as well as a current circulation path for energy returned from a pure inductive load. Related to this issue, the '309 amplifier simply cannot drive a pure inductive load. With the configurations of amplifier circuit 205, energy flow-back circuit 207 and output generator circuit 206, excessive energy returned from either side of output generator circuit 206, as described above, is captured by the respective return-energy capture circuitries of either amplifier sub-circuits 205A or 205B. The pair of energy return nodes of each amplifier sub-circuit are coupled to a corresponding energy flow-back sub-circuit, which provides a path for energy captured at the pair of energy return nodes to flow back to the primary side, where DC power supply circuit 201 provides storage and a current circulation path for the return energy. Thus, the disclosed switching amplifier 200 provides storage as well as a current circulation path for energy returned from a pure inductive load, thereby adequately addressing this new issue arising from the stage-combining. Accordingly, unlike the '309 amplifier which cannot drive pure inductive load, the disclosed switching amplifier 200 can also drive pure inductive load.

Figure 5:
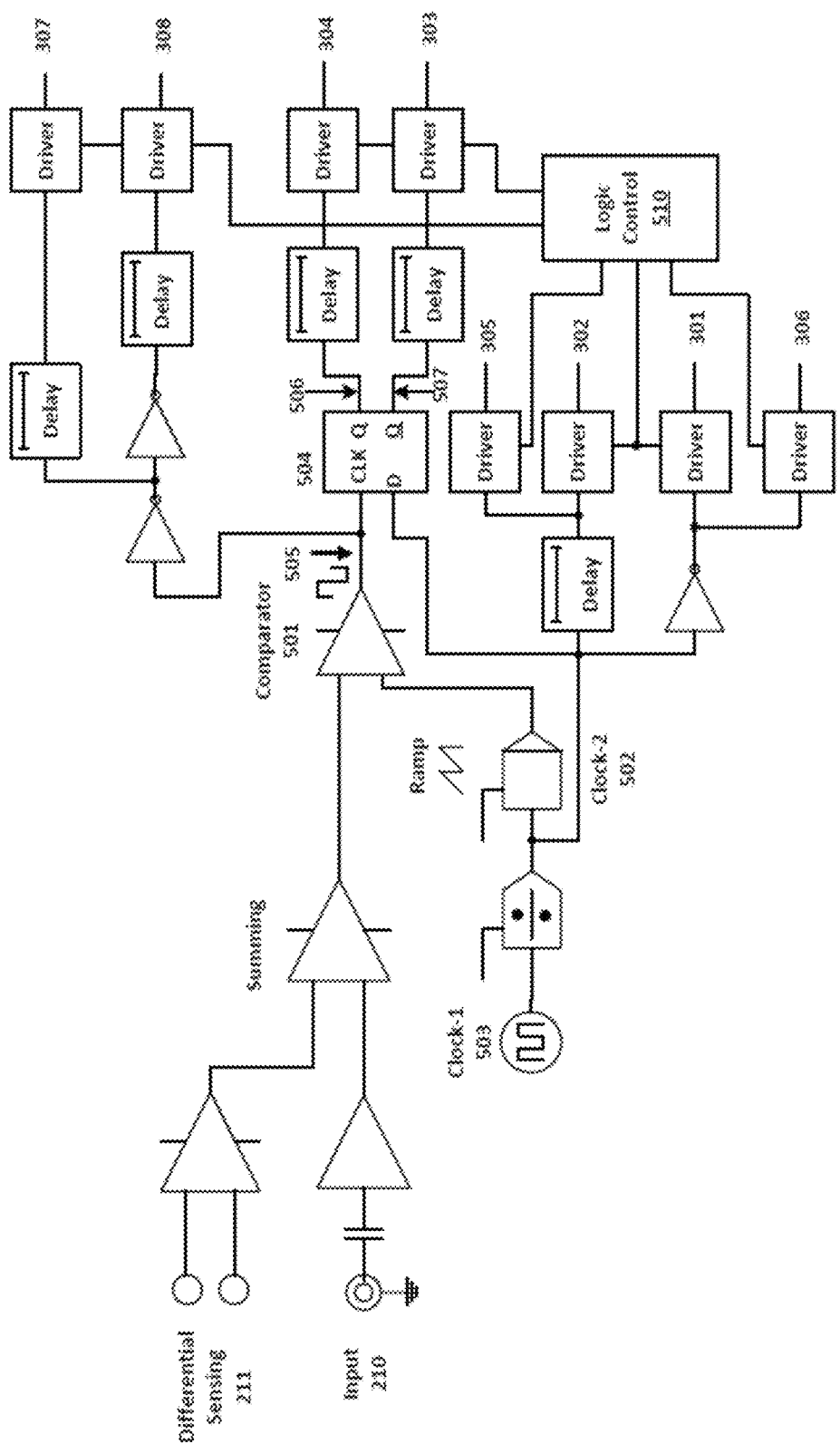
FIG. 5 is a simplified schematic circuit diagram illustrating an exemplary implementation of a modulator circuit used in the disclosed switching transformer 200, according to one or more embodiments of the present disclosure.

Turning to modulator circuit 203, FIG. 5 is schematic circuit diagram illustrating an exemplary implementation of modulator circuit 203 used in switching amplifier 200 illustrated in FIG. 3, according to one or more embodiments of the present disclosure. Referring to FIG. 5, modulator circuit 203 receives input signal 210 as an input signal. Optionally, modulator circuit 203 receives output differential signal 211 generated across load 150 (via differential sensing) as a feedback signal. As well-known, using two sensing amplifiers respectively applied to input signal 210 and differential feedback signal 211 and one summing amplifier, with two respective output signals of the two sensing amplifiers fed into the summing amplifier, error correction can be achieved with the output signal of the summing amplifier, which is an error-corrected version of input signal 210 (hereinafter referred to as "error-corrected input signal 210").

Comparator 501 receives error-corrected input signal 210 as its first input and a tooth wave ramp signal as a second input, and outputs signal 505, which is pulse-width modulated (PWM) with input signal 201. Using known configurations applicable to comparator 501 and the tooth wave ramp signal, PWM signal 505 has the signed modulation index $$k = \frac{50\% - \beta}{50\%},$$

where β is the duty cycle (in percentage) used to represent a signed input signal level m relative to the absolute of maximum signal level n of input signal 210.

In one embodiment, as shown, the tooth wave ramp signal fed into comparator 501 is generated by a ramp generator receiving a clock signal 502 as its CLOCK signal using known techniques. Clock signal 502 is produced by a clock divider driven by a much faster clock signal 503. The frequency of clock signal 502 is a fraction of that of clock signal 503 depending on the division performed by the clock divider on clock signal 503. For example, if the frequency of original clock signal 503 is 4 Mhz and the clock divider divides a clock signal by 10, then the frequency of clock signal 502 is 400 Khz. With the ramp generator receiving clock signal 502 as its clock signal, the tooth wave ramp signal generated therefrom has a frequency twice the frequency of clock signal 502, resulting in PWM signal 505 having a fundamental frequency twice the frequency of clock signal 502.

PWM signal 505 is fed into a rising edge triggered D flip-flop 504 as its CLK input, while clock signal 502 is fed into D flip-flop 504 as its D input. With this configuration, D flip-flop 504 generates pulse train signal 506 having equal 50% duty cycles and phase-shifted with respect to clock signal 502 (which functions as a reference signal), with each unequal phase shift corresponding to an unequal pulse width in PWM signal 505. Thus, pulse train signal 506 is a phase shifted modulated (PSM) signal, which hereinafter, will be referred to as "PSM signal 506." In particular, with this configuration, PSM signal 506 is phase shift modulated with input signal 210, with each phase shift therein corresponding to a duty cycle in PSM signal 505 (which, as noted, is used to represent an analog signal level of input signal 210).

Additionally, the fundamental frequency of PSM signal 506 is the same as the frequency of clock signal 502, which is half of the fundamental frequency of PSM signal 505. Thus, the fundamental frequency of PSM signal 506 is half of the fundamental frequency of PWM signal 505. Hence, a 50% duty cycle in PWM signal 505, which corresponds to zero analog input signal level, is transformed into a 90° phase shift in PSM signal 506. Therefore, for PSM signal 506, the signed modulation index $$k = \frac{90 - \alpha}{90},$$

where $\alpha$ is the phase shift (in degree) used to represent a signed input signal level m. As noted above, for PWM signal 505, $$k = \frac{50\% - \beta}{50\%}.$$

Thus, $$k = \frac{50\% - \beta}{50\%} = \frac{90 - \alpha}{90},$$

which yields $$\beta = \frac{\alpha}{180} \times 100\%.$$

Thus, each phase shift $\alpha$ in PSM signal 506 corresponds to $$\frac{\alpha}{180} \times 100\%$$

duty cycle in PWM signal 505.

As illustrated, PSM signal 506 is subsequently used to generate duplicate PSM signal 304 (which drives isolation drive transformer T304 of power driver circuit 202) using a known configuration including delay circuitry drive circuitry. Similarly, clock signal 502, as illustrated, is used to generate duplicate signals 302 and 305 (which drives isolation driver transformers T302 and T305 of power driver circuit 202, respectively). Furthermore, using known logic control module 510 (which sets proper timing and dead times) coupled to drive circuitries, identical signals 302 and 305 are likewise outputted as reference signals to PSM signal 304. Similarly, clock signal 502 is also used to generate identical signals 301 and 306 (which drives isolation driver transformers T301 and T306 of power driver circuit 202), with signals 301 and 306 being inverted versions of identical signals 302 and 305 with respect to the common horizontal centerline of their respective waveforms. Likewise, signal 507—which is the inverted version of PSM signal 506 outputted by D flip-flop 504—is used to generate duplicate signal 303 (which drives isolation driver transformer T303), with signal 303 being an inverted version of PSM signal 304 with respect to the common horizontal centerline of their respective waveforms.

Besides being used to generate PSM signal 506, PWM signal 505 is also used to generate control signals 307 and 308, which drive switches S307 and S308 of output generator circuit 206, respectively. Particularly, the fundamental frequency of PWM signal 505 is twice the frequency of clock signal 502, and thus is twice the fundamental frequency of PSM signal 506, PSM signal 304, signal 3B, and signal (3A-3B). The fundamental frequency of signal 3D is twice that of signal (3A-3B) as well. Thus, both PWM signal 505 and signal 3D have the same fundamental frequency. Moreover, for each phase shift $\alpha$, both signals have a corresponding duty cycle $$\beta = \frac{\alpha}{180} \times 100\%.$$

Thus, PWM signal 505 and signal 3D have similar waveforms except for the delay there-between and different pulse amplitudes. As noted, control signal 308 tracks and follows signals 3D. As a result, signal 308 is generated by PWM signal 505 using, as illustrated, a configuration including double inverters and known delay and drive circuitries. As noted, pulses of signals 307 and pulses of signal 308 alternate with respect to each other. Based on this fixed relationship between signals 307 and 308, signal 307 is also generated by PWM signal 505 using, as illustrated, a configuration including a single inverter and known delay and drive circuitries.

Returning to FIG. 3, in this embodiment, spike-clamping circuit 208 comprises a pair of symmetrical clamping diodes D307 and D308 with respect to a common connection node 3J there-between. Schematically, diodes D307 and D308 are disposed at opposites sides of node 3J with D307 disposed on the left side and D308 disposed on the right side. The cathodes of diodes D307 and D308 are electrically coupled to each other via node 3J. Anodes of diodes D307 and D308 are electrically coupled to the two input nodes of output generator circuit 206 situated on the same sides with respect to load 150 as their sides with respect to node 3J, respectively. Thus, the anodes of diodes D307 and D308 are electrically coupled to nodes 3D and 3E, respectively. Spike-clamping circuit 208 further comprises capacitor C304, with its one end electrically coupled to node 3J (thus coupled to cathodes of Diodes D307 and D308) and the other end coupled to ground.

With the illustrated configuration of spike-clamping circuit 208, both diodes D307 and D308 are biased in the forward direction. Thus, excess voltage spikes at nodes 3D and 3E (resulting from return energy) on both sides of load 150 are clamped by diodes D307 and D308 of same sides (with respect to common connection node 3J), respectively. The clamped energy is then stored in capacitor C204. As illustrated, spike-clamping circuit 208 is electrically coupled to Aux power supply 209 via capacitor C204. Thus, the clamped energy stored in capacitor C204 can be recirculated to power one or more modules powered by Aux power supply 209. In this embodiment, modulator circuit 203 is powered by Aux power supply 209. Therefore, the clamped energy stored in capacitor is recirculated to power modulator circuit 203 through Aux power supply 209, which further increases the overall efficiency of the disclosed switching power amplifier 200.

Below is table listing exemplary components and their respective exemplary nominal values as used to implement the disclosed switching amplifier 200 illustrated in FIG. 3.

| Component | Nominal Value |
|---|---|
| C301 | 1000 uF |
| C302 | 1 uF |
| C303 | 1 uF |
| C304 | 10 uF |
| C305 | 2 uF |
| C306 | 2 uF |
| L301 | 1.5 uH |
| L302 | 1.5 uH |
| L303 | 30 uH |
| L304 | 30 uH |

Figure 6A:
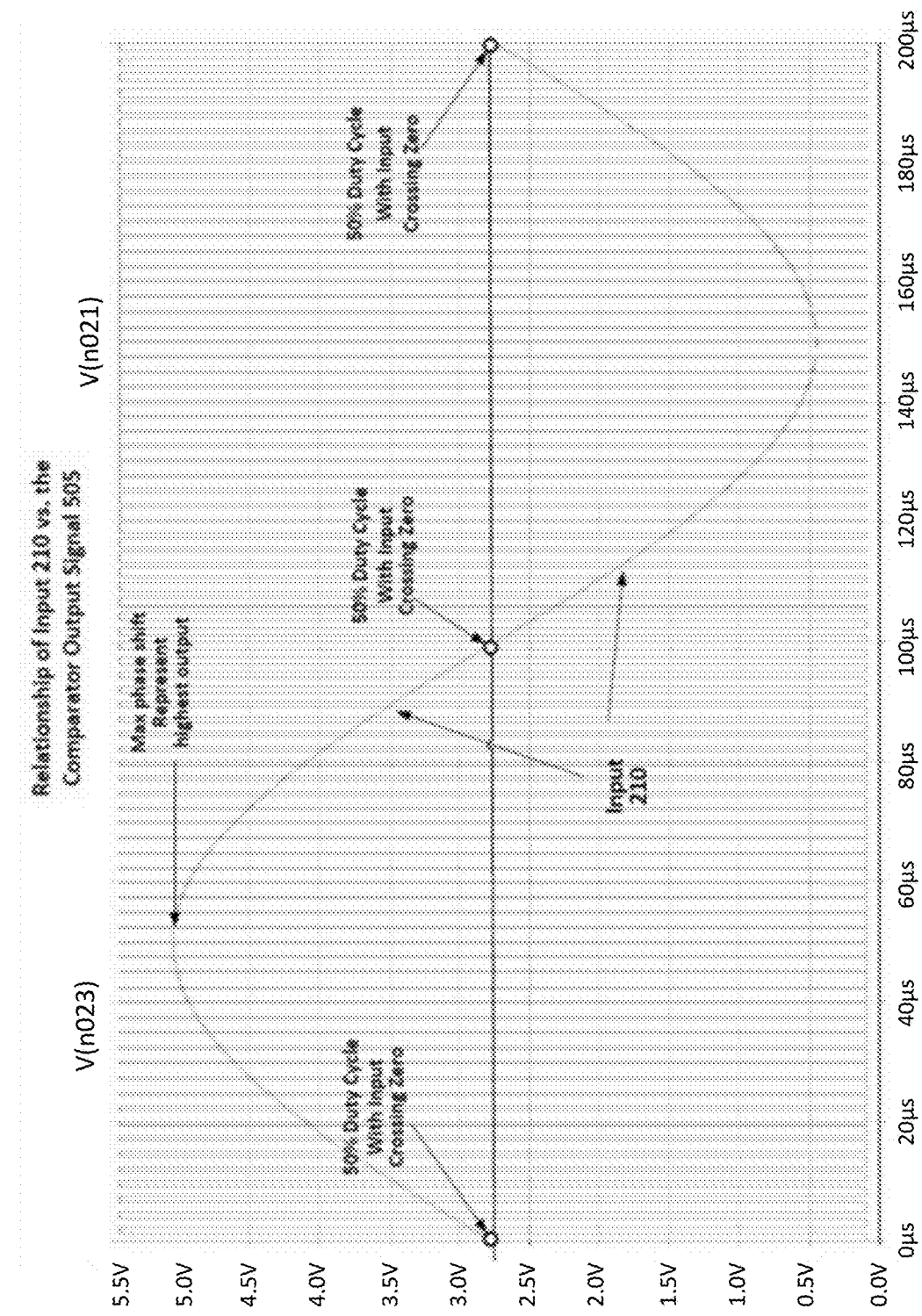
FIGS. 6A-C illustrate exemplary waveforms of relevant signals generated at different points of a signal amplification operation of the disclosed switching transformer 200, according to one or more embodiments of the present disclosure.
Figure 6B:
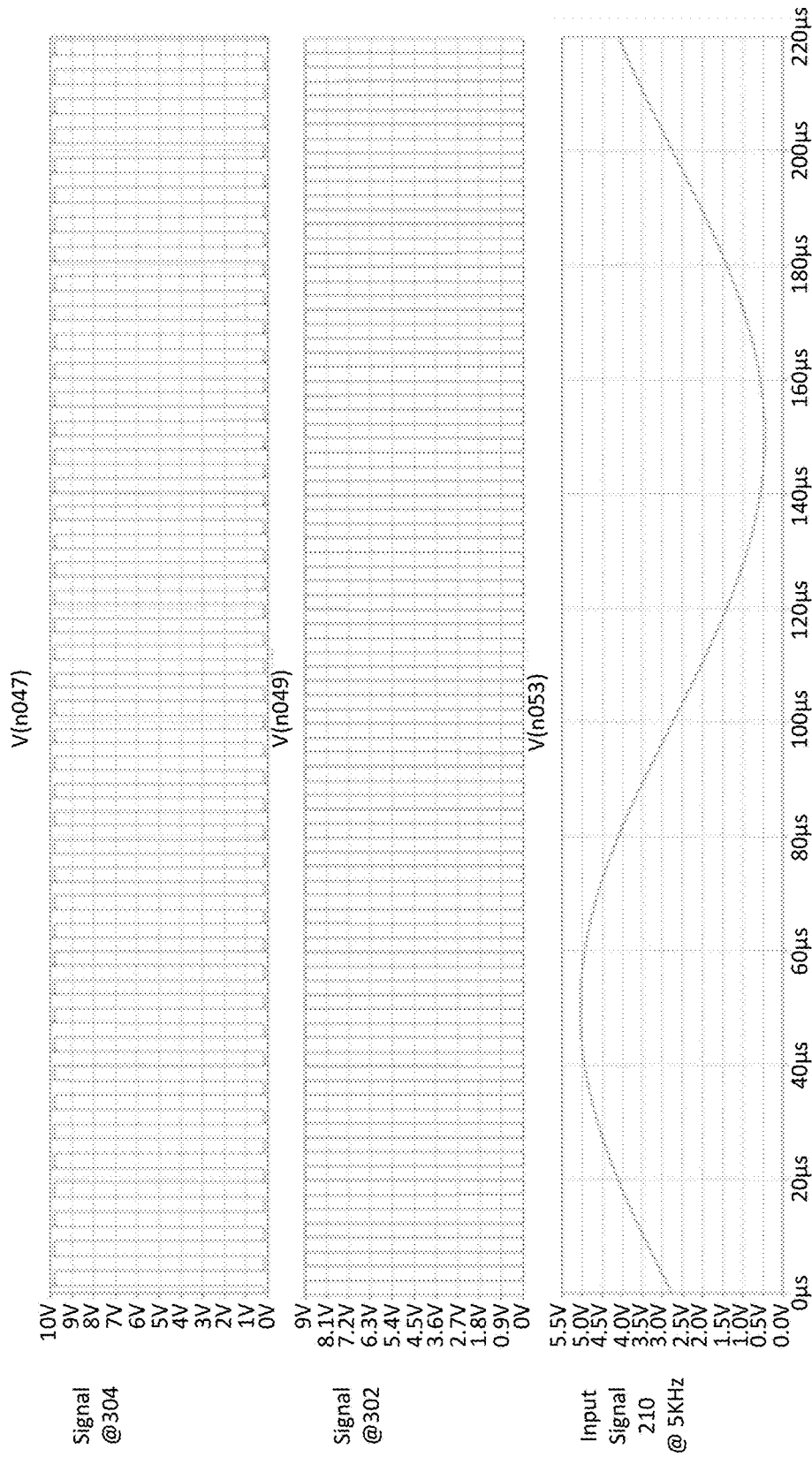
Figure 6C:
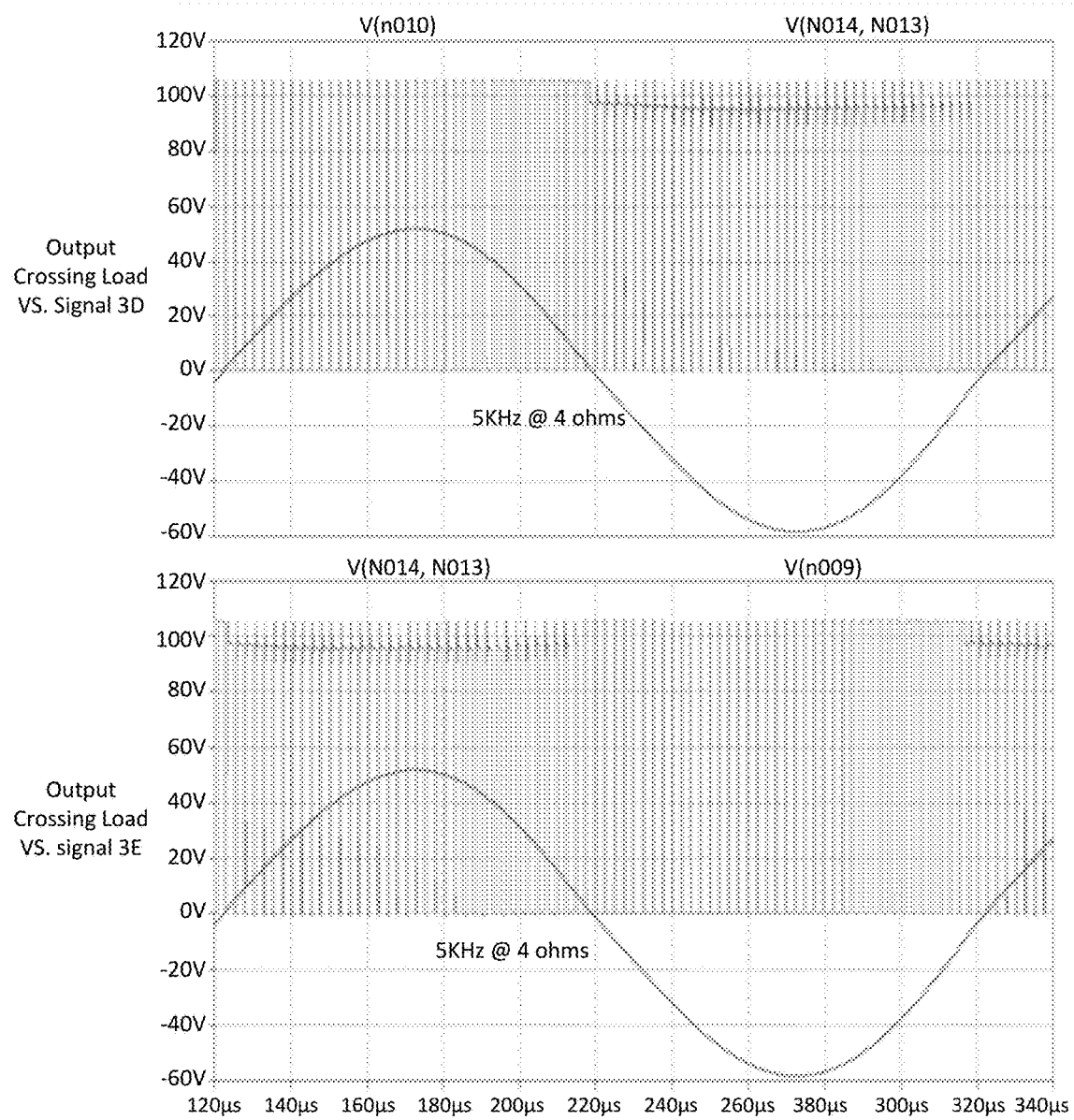

FIGS. 6A-C illustrates exemplary waveforms of relevant signals generated at different times during a signal amplification operation of the disclosed switching transformer 200, according to one or more embodiments of the present disclosure.

Specifically, FIG. 6A illustrates an exemplary waveform of PWM signal 505, with the waveform of input signal 210 being superimposed thereon. As illustrated, for PWM signal 505, each duty cycle corresponds to a sampled analog signal level of input signal 210. A pulse width equal to 50% duty cycle corresponds to zero analog signal level. The narrowest pulse width (closest to 0% duty cycle) corresponds to the highest signed signal level. The widest pulse width (closest to 100% duty cycle) corresponds to the lowest signed signal level. So if input signal 210 is a sine wave signal, as the signal level of input signal 210 keeps rising during a stretch, the corresponding series of successive pulse widths becomes narrower and narrower during a stretch. As the signal level of the input signal 210 keeps falling during a stretch, the corresponding series of successive pulse widths becomes wider and wider during a stretch.

FIG. 6B illustrates exemplary waveforms of PSM signal 304, reference signal 302 and input signal 210. As illustrated, both PSM signal 304 and reference signal 302 are pulse train signals with equal 50% duty cycles. PSM signal 304 is phase-shifted with respect to reference signal 302, with each phase shift corresponding to a sampled signal level of input signal 210.

FIG. 6C illustrates exemplary waveforms of signals 3D and 3E, each with the waveform of output differential signal 211 being superimposed thereon. As illustrated, a signal level of output differential signal 211 corresponds to the signed difference between the corresponding duty cycles of signals 3D and 3E.

As demonstrated by the exemplary configurations of its circuit modules illustrated and described above, the presently disclosed switching transformer 200, in combining two stages into a single stage, uses a distinct design approach from that of the '309 amplifier.

In one aspect, the design of switching transformer 200 adequately addresses the aforementioned new issues arising from combining two stages into a single stage. Thus, switching transformer 200 no longer is forced to use a pair of tightly magnetically coupled inductors as respective parts of a pair of low pass filters situated across load 150.

In another aspect, the design of switching transformer 200 enables bidirectional energy flow between the primary side and the secondary side of a switching transformer. The enabling of bidirectional energy flow not only adequately addresses an aforementioned new issue arising from combining two stages into a single stage—namely, not readily having storage and a circulation path for energy returned from a pure inductive load—but also further increases the system efficiency.

In yet another aspect, the design of switching transformer 200 allows voltage spikes at output nodes to be clamped, and allows the clamped energy to be stored and circulated to power other one or more associated modules, thereby further increasing the system efficiency.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof.

As one example, although the present disclosure discloses a phase-shifted modulation scheme as the modulation scheme used by the modulator circuit 203, other modulation schemes may be used in addition to or in place of phase-shifted modulation without departing from the spirit and scope of the disclosure. As another example, power driver circuit 202 may employ a different power driving scheme to produce transformer driver signals without departing from the spirit and scope of the disclosure.

Therefore, it is intended that the disclosure not be limited to the particular embodiments disclosed for carrying out this disclosure, but that the disclosure will include all embodiments falling within the scope of the appended claims.

What is claimed is:

1. A switching power amplifier, the amplifier comprising:
 a transformer unit comprising a set of one or more switching transformers each having a respective pair of a primary winding and a secondary winding with the respective primary and secondary windings corresponding to each other;
 a modulator unit configured to receive an input signal, the modulator unit configured to modulate the received input signal in generating and supplying at least one set of one or more switching drive signals carrying information about the input signal and one set of one or more switching control signals carrying information about the input signal;
 a primary side unit coupled to the modulator unit and coupled to the respective primary winding of each transformer of the transformer unit, the primary side unit comprising a power supply function configured to supply power, the primary side unit configured to generate, for the set of one or more transformers of the transformer unit, a set of one or more transformer-driving switching carrier signals driving the respective one or more primary windings, the set of one or more transformer-driving switching carrier signals carrying information about the input signal and generated using the set of one or more switching drive signals supplied from the modulator unit; and a secondary side unit coupled to the modulator unit and coupled to the respective secondary winding of each transformer of the transformer unit, the secondary side unit configured to generate, for the set of one or more transformers of the transformer unit, one set of one or more amplified switching carrier signals at one corresponding set of one or more terminals of the respective one or more secondary windings upon the set of one or more transformer-driving switching carrier signals respectively driving the respective one or more primary windings, the set of one or more amplified switching carrier signals carrying information about the input signal, the secondary side unit configured to demodulate, under the control of the set of one or more switching control signals supplied from the modulator unit, the set of one or more amplified switching carrier signals to generate an amplified output signal across a load with the amplified output signal being an amplified replica of the input signal, the secondary side unit configured, for the set of one or more transformers of the transformer unit, to capture power returning from the load through the respective one or more secondary windings and flow the captured return power from the respective one or more secondary windings to respective one or more recirculation circuits configured to recirculate the captured return power to a destination power supply unit configured to store and recirculate power.

2. The switching power amplifier of claim 1, wherein the power supply function of the primary side unit comprises the destination power supply unit, the power supply function of the primary side unit configured to store and recirculate power flowing back from the secondary side unit.

3. The switching power amplifier of claim 1, wherein the set of one or more switching transformers of the transformer unit comprises two transformers.

4. The switching power amplifier of claim 1, wherein the switching power amplifier further comprises energy flow-back circuitry coupled to the secondary side unit and configured to rectify the return power captured by the secondary side unit prior to the return power flowing to the destination power supply unit.

5. The switching power amplifier of claim 1, wherein the secondary side unit comprises a return-power-capturing rectifier circuitry coupled to the respective secondary winding of each transformer of the transformer unit, the return-power-capturing rectifier circuitry comprising a set of one or more amplified-rectifier nodes and configured to generate the set of one or more amplified switching carrier signals respectively at the set of one or more amplified-rectifier nodes through full-wave rectifying with respect to the respective one or more secondary windings of the set of transformers of the transformer unit, the return-power-capturing rectifier circuitry comprising a set of one or more power-flowing nodes and configured to capture the return power and recirculate the captured return power through the set of one or more power-flowing nodes.

6. The switching power amplifier of claim 1, wherein the secondary side unit comprises an output generator circuit configured to demodulate, under the control of the set of one or more switching control signals received from the modulator unit, the set of one or more amplified switching carrier signals to generate the amplified output signal across the load, the output generator circuit configured to cause one or more currents flowing to a ground through the load in demodulating the set of one or more amplified switching carrier signals under the control of the set of one or more switching control signals.

7. The switching power amplifier of claim 1, wherein the secondary side unit configured to clamp excess power otherwise causing voltage spikes in the secondary side unit, the secondary side unit configured to store and recirculate the clamped power.

8. The switching power amplifier of claim 7, wherein the secondary side unit is coupled to an auxiliary power supply unit and configured to recirculate the clamped power to the auxiliary power supply unit.

9. The switching power amplifier of claim 1, wherein the modulator unit receives power from an auxiliary power supply unit.

10. The switching power amplifier of claim 1, wherein the modulator unit is configured to phase-shift modulate the input signal on sampled signed signal levels of the input signal in relation to the amplitude of the input signal in generating and supplying the set of one or more switching drive signals and the set of one or more switching control signals.

11. The switching power amplifier of claim 6, wherein the output generator circuit is configured to demodulate the set of one or more amplified switching carrier signals using a set of one or more low-pass filters and a set of one or more switches corresponding to the set of one or more low-pass filters, the set of one or more low-pass filters each having one inductor and one capacitor, the set of one or more switches respectively controlled by the set of one or more switching control signals to selectively enable functioning of a corresponding low-pass filter of the set of one or more low-pass filters while simultaneously cause a current to flow to the ground through the load.

12. The switching power amplifier of claim 11, wherein the set of one or more low-pass filters includes at least two low-pass filters, and the respective inductors of the at least two low-pass filters are individual inductors with no or loose magnetic coupling from one another.

13. The switching power amplifier of claim 4, wherein the energy flow-back circuitry comprises a set of one or more transformers each having a primary winding coupled to the secondary side unit to receive the captured return power and a secondary winding coupled to the destination power supply unit through a rectifier function.

14. The switching power amplifier of claim 4, wherein for each transformer of the transformer unit, the respective secondary winding comprises a split winding having a set of sub-windings each coupled to the return-power-capturing rectifier circuitry, the return-power-capturing rectifier circuitry comprising, for each sub-winding of the set of sub-windings of the respective secondary winding, a corresponding diode coupled to the respective sub-winding and biased in the reverse direction, the return-power-capturing rectifier circuitry configured to perform, with respect to the respective secondary winding, full-wave rectifying through the corresponding reverse-biased diodes respectively coupled to the sub-windings of the respective secondary winding.

* * * * *